United States Patent
Byun et al.

(10) Patent No.: US 11,139,020 B2
(45) Date of Patent: Oct. 5, 2021

(54) MEMORY CONTROLLER AND METHOD OF OPERATING THE SAME

(71) Applicant: SK hynix Inc., Gyeonggi-do (KR)

(72) Inventors: Eu Joon Byun, Gyeonggi-do (KR); Jea Young Zhang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/521,165

(22) Filed: Jul. 24, 2019

(65) Prior Publication Data
US 2020/0202919 A1    Jun. 25, 2020

(30) Foreign Application Priority Data

Dec. 19, 2018   (KR) .................. 10-2018-0165688

(51) Int. Cl.
*G11C 7/22*       (2006.01)
*G11C 11/409*     (2006.01)
*G06F 13/16*      (2006.01)
*G06F 11/10*      (2006.01)

(52) U.S. Cl.
CPC ........ *G11C 11/409* (2013.01); *G06F 11/1016* (2013.01); *G06F 13/1668* (2013.01); *G06F 2212/7201* (2013.01)

(58) Field of Classification Search
CPC ............ G06F 11/1016; G06F 13/1668; G06F 2212/7201; G11C 11/409
See application file for complete search history.

(56) References Cited

U.S. PATENT DOCUMENTS

2012/0117297 A1   5/2012   Ish
2014/0010152 A1   1/2014   Park
2014/0281689 A1   9/2014   Fischer
(Continued)

FOREIGN PATENT DOCUMENTS

KR         10-0963140       6/2010
KR      10-2014-0057454     5/2014
(Continued)

OTHER PUBLICATIONS

Jeong, W et al., Improving Flash Storage Performance by Caching Address Mapping Table in Host Memory, 2017, HotStorage.
(Continued)

*Primary Examiner* — Toan K Le
(74) *Attorney, Agent, or Firm* — IP & T Group LLP

(57) ABSTRACT

A memory controller includes a mapping data controller configured to generate extended mapping data including mapping information and an additional field in response to an extended mapping data request received from a host and to generate data generation information indicating that the extended mapping data has been generated, wherein the mapping information indicates a mapping relationship between a logical block address and a physical block address and a bitmap information generator configured to receive the data generation information and generate bitmap information. The bitmap information may include information for changing a bit value corresponding to a mapping data group including the extended mapping data, among bit values included in a bitmap, to indicate the extended mapping data, and the mapping data group may include a plurality of pieces of mapping data.

19 Claims, 17 Drawing Sheets

(56) References Cited

U.S. PATENT DOCUMENTS

| | | |
|---|---|---|
| 2015/0095546 A1 | 4/2015 | Bennett et al. |
| 2015/0347296 A1 | 12/2015 | Kotte et al. |
| 2016/0048459 A1* | 2/2016 | Oh .................... G06F 12/0246 |
| | | 711/103 |
| 2017/0192902 A1* | 7/2017 | Hwang ............... G06F 12/0246 |
| 2018/0157427 A1 | 6/2018 | Hong et al. |
| 2019/0121570 A1* | 4/2019 | Kim .................... G06F 12/0246 |
| 2020/0004671 A1 | 1/2020 | Neufeld et al. |
| 2020/0183822 A1* | 6/2020 | Bates ...................... H04L 43/50 |
| 2020/0202919 A1 | 6/2020 | Byun et al. |

FOREIGN PATENT DOCUMENTS

| | | |
|---|---|---|
| KR | 10-2015-0132151 | 11/2015 |
| KR | 10-2017-0031389 | 3/2017 |
| KR | 10-2017-0081126 A | 7/2017 |
| KR | 10-1798036 | 11/2017 |
| KR | 10-2018-0016679 | 2/2018 |

OTHER PUBLICATIONS

Office Action issued by the USPTO for U.S. Appl. No. 16/589,953 dated May 28, 2021.

* cited by examiner

FIG. 4

| MAPPING DATA TYPE | MAPPING DATA (Mapping_DATA) | Logical Block Address, LBA | Physical Block Address, PBA |
|---|---|---|---|
| NORMAL MAPPING DATA | Mapping_DATA1 | LBA1 | PBA1 |
| | Mapping_DATA2 | LBA2 | PBA2 |
| | Mapping_DATA3 | LBA3 | PBA3 |
| | Mapping_DATA4 | LBA4 | PBA4 |

FIG. 5

| MAPPING DATA TYPE | MAPPING DATA (Mapping_DATA) | Logical Block Address, LBA | Physical Block Address, PBA | ADDITIONAL FIELD |
|---|---|---|---|---|
| EXTENDED MAPPING DATA | Mapping_DATA2a | LBA2 | PBA2 | k2a |
| | Mapping_DATA4a | LBA4 | PBA4 | k4a |

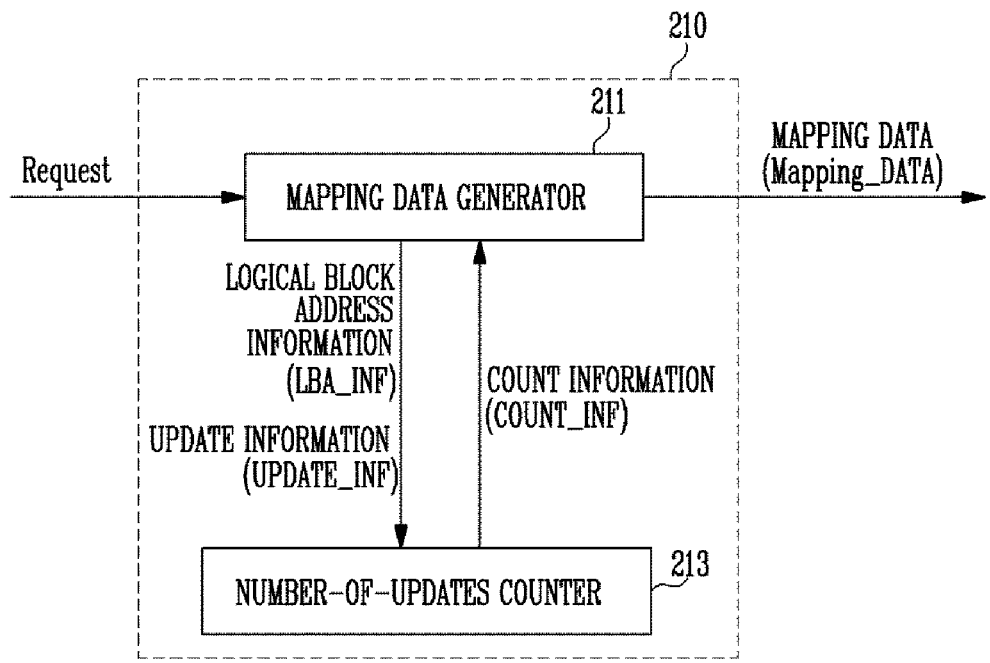

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2018-0165688, filed on Dec. 19, 2018, which is incorporated herein by reference in its entirety.

BACKGROUND

Field of Invention

Various embodiments of the present disclosure generally relate to an electronic device, and more particularly, to a memory controller and a method of operating the memory controller.

Description of Related Art

A storage device stores data under the control of a host device such as a computer, a smartphone, or a smartpad. Examples of a storage device include a hard disk drive (HDD) which stores data in a magnetic disk, and a solid state drive (SSD) or a memory card which stores data in a semiconductor memory, particularly, a nonvolatile memory.

A storage device may include a memory device in which data is stored and a memory controller which controls the storage of data in the memory device. Memory devices may be a volatile memory or a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory controller for generating mapping data having improved reliability and a method of operating the memory controller.

An embodiment of the present disclosure may provide for a memory controller for controlling a memory device. The memory controller may include a mapping data controller configured to generate extended mapping data including mapping information and an additional field in response to an extended mapping data request received from a host and to generate data generation information indicating that the extended mapping data has been generated, wherein the mapping information indicates a mapping relationship between a logical block address and a physical block address and a bitmap information generator configured to receive the data generation information and generate bitmap information, wherein the bitmap information includes information for changing a bit value corresponding to a mapping data group including the extended mapping data, among bit values in a bitmap stored in the memory device, to indicate the extended mapping data, and wherein the mapping data group comprises a plurality of pieces of mapping data, and wherein the data generation information includes information about a logical block address in the extended mapping data.

An embodiment of the present disclosure may provide for a method of operating a memory controller for controlling a memory device. The method may include receiving an extended mapping data request from a host, generating normal mapping data including mapping information in response to the extended mapping data request, wherein the mapping information indicates a mapping relationship between a logical block address and a physical block address, generating extended mapping data including the mapping information and an additional field, generating data generation information indicating that the extended mapping data has been generated and receiving the data generation information and then generating bitmap information, wherein the bitmap information includes information for changing a bit value corresponding to a mapping data group including the extended mapping data, among bit values in a bitmap stored in the memory device, to indicate the extended mapping data, and wherein the mapping data group comprises a plurality of pieces of mapping data.

An embodiment of the present disclosure may provide for a method of operating a memory controller for controlling a memory device. The method may include receiving an extended mapping data request from a host, generating normal mapping data including mapping information in response to the extended mapping data request, wherein the mapping information indicates a mapping relationship between a logical block address and a physical block address, generating extended mapping data including the mapping information and an additional field, generating data generation information indicating that the extended mapping data has been generated and receiving the data generation information and then generating bitmap information, wherein the bitmap information includes information for changing a bit value corresponding to a mapping data group including the extended mapping data, among bit values in a bitmap stored in the memory device, to indicate the extended mapping data, wherein the mapping data group comprises a plurality of pieces of mapping data, wherein the extended mapping data includes a logical block address of a hot data area, and wherein the hot data area is determined based on a frequency with which the host accesses the memory controller.

An embodiment of the present disclosure may provide for a method of operating a memory controller for controlling a memory device. The method may include receiving an extended mapping data request from a host, generating normal mapping data including mapping information in response to the extended mapping data request, wherein the mapping information indicates a mapping relationship between a logical block address and a physical block address, generating extended mapping data including the mapping information and an additional field, generating data generation information indicating that the extended mapping data has been generated and receiving the data generation information and then generating bitmap information, wherein the bitmap information includes information for changing a bit value corresponding to a mapping data group including the extended mapping data, among bit values in a bitmap stored in the memory device, to indicate the extended mapping data, wherein the mapping data group comprises a plurality of pieces of mapping data, wherein the data generation information includes information about a logical block address in the extended mapping data.

An embodiment of the present disclosure may provide for a data processing system. The data processing system may include a host configured to provide an update or generation request together with a logical address or a read request together with first map data, a memory device configured to store user data and second map data and a controller configured to control the memory device to update the second map data according to the logical address and provide the host with the updated second map data as the first map data, in response to the update request, increase a number of updates of the second map data upon the update thereof generate and provide a new second map data corresponding to the provided logical address to the host in response to the generation request and provide the host with the user data in response to the read request provided together with the first map data, the user data corresponding to one of the first map data and the second map data according to numbers of updates of the first and second map data, wherein each of the first and second map data is extended map data representing the number of updates thereof and a mapping relationship between logical and physical addresses.

BRIEF DESCRIPTION OF THE DRAWINGS

FIG. 4 is a diagram for explaining normal mapping data.

FIG. 5 is a diagram for explaining extended mapping data.

FIG. 6 is a diagram illustrating a method of generating extended mapping data in which the number of updates of mapping data is stored in an additional field.

FIG. 7 is a diagram for explaining a bitmap stored in a memory device, such as that of FIG. 1.

DETAILED DESCRIPTION

Figure 1:
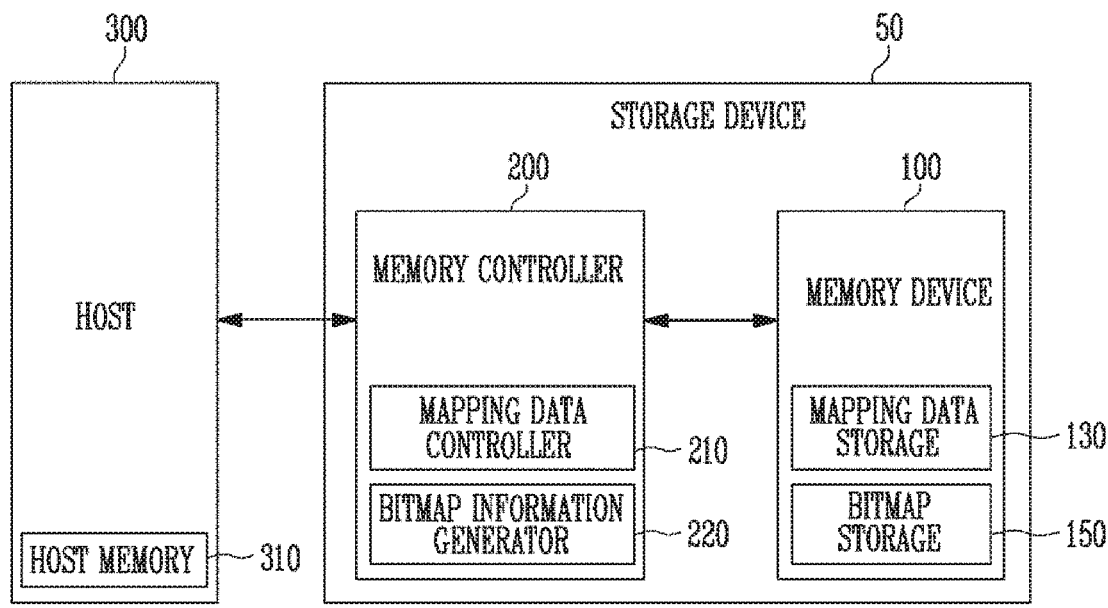
FIG. 1 is a block diagram illustrating a storage device.

Specific structural functional description presented herein is directed to embodiments of the present disclosure. The present invention, however, is not limited to either the specific description provided or any of the embodiments described herein.

While various embodiments are described in detail, the present invention is not limited to any particular embodiment(s). Rather, the present invention encompasses all changes, equivalents, alternatives and substitutes that do not depart from the spirit and technical scope of the present disclosure.

It will be understood that, although the terms "first" and/or "second" may be used herein to identify various elements, these elements should not be limited by these terms. These terms are only used to distinguish one element from another element that otherwise have the same or similar names. For example, a first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art is omitted to avoid obscuring the subject matter of the present disclosure. This aims to make the subject matter of the present disclosure clear.

Various embodiments of the present disclosure are described more fully below with reference to the accompanying drawings, in which preferred embodiments of the present disclosure are illustrated, so that those skilled in the art are able to practice the invention. Throughout the specification, reference to "an embodiment," "another embodiment" or the like is not necessarily to only one embodiment, and different references to any such phrase are not necessarily to the same embodiment(s).

FIG. 1 is a block diagram illustrating a storage device.

Referring to FIG. 1, a storage device 50 may include a memory device 100 and a memory controller 200.

The storage device 50 may be a device which stores data under the control of a host 300, and may include, for example, a mobile phone, a smartphone, an MP3 player, a laptop computer, a desktop computer, a game console, a television (TV), a tablet PC, or an in-vehicle infotainment system.

The storage device 50 may be configured as any of various types of storage devices depending on a host interface that is a communication scheme with the host 300. For example, the storage device 50 may be implemented as a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-e or PCIe) card-type storage device, a compact flash (CF) card, a smart media card, or a memory stick.

The storage device 50 may be manufactured in any of various types of packages. For example, the storage device 50 may be manufactured as package on package (POP), system in package (SIP), system on chip (SOC), multi-chip package (MCP), chip on board (COB), wafer-level fabricated package (WFP), or wafer-level stack package (WSP).

The memory controller 200 may control the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100.

The memory controller 200 may include a mapping data controller 210. The mapping data controller 210 may generate mapping data Mapping_DATA in response to a request received from the host 300. In an embodiment, the request received from the host 300 may be an extended mapping data request or a normal mapping data request.

When the request received from the host 300 is a normal mapping data request, the mapping data controller 210 may generate normal mapping data. The normal mapping data may include mapping information indicating mapping relationships between logical block addresses (LBA) and physical block addresses (PBA). The normal mapping data may not include an additional field.

When the request received from the host 300 is an extended mapping data request, the mapping data controller 210 may generate extended mapping data. The extended mapping data may be mapping data Mapping_DATA including the logical block address (LBA) included in a hot data. The hot data includes a plurality of logical block addresses. The hot data may be determined based on the frequency with which the host 300 outputs a specific logical block address to memory controller 200. In an embodiment, the host 300 may set the hot data.

The extended mapping data may include normal mapping data and an additional field. In the additional field, the number of updates of the extended mapping data or data required for error correction to a read data from a memory device (e.g. BCH (Bose-Chaudhuri-Hocquenghem) code or LDPC (Low-Density Parity-Check) code, etc.) may be stored.

In an embodiment, when the mapping data controller 210 generates extended mapping data in response to an extended mapping data request from the host 300, the mapping data controller 210 may generate and output data generation information DG_INF. The data generation information DG_INF may include information indicating that the extended mapping data has been generated. Also, the data generation information DG_INF may include information about a logical block address (LBA) included in the extended mapping data. Bitmap information BM_INF may be generated based on the data generation information DG_INF. The bitmap information BM_INF may indicate that the mapping data Mapping_DATA generated by the mapping data controller 210 is the extended mapping data.

In an embodiment, the mapping data controller 210 may receive the mapping data Mapping_DATA stored in the memory device 100 in response to a request from the host 300. The request from the host 300 may be for storing the extended mapping data in a host memory 310. When the mapping data Mapping_DATA stored in the memory device 100 is received by the mapping data controller 210, a bit value BIT_VAL included in a bitmap stored in the memory device 100 may be received together with the mapping data Mapping_DATA by the mapping data controller 210. The mapping data controller 210 may perform an operation of generating and outputting extended mapping data and/or an operation of outputting the mapping data Mapping_DATA received from the memory device 100, based on the mapping data Mapping_DATA and the bit value BIT_VAL received from the memory device 100.

In an embodiment, the mapping data controller 210 may receive the mapping data Mapping_DATA stored in the host 300, together with the request from the host 300. The request from the host 300 may be a read request for data stored in the memory device 100. The mapping data Mapping_DATA stored in the host 300 may be extended mapping data. The extended mapping data may include normal mapping data and an additional field.

The mapping data controller 210 may receive the mapping data Mapping_DATA, corresponding to the request received from the host 300, from the memory device 100. The mapping data Mapping_DATA stored in the memory device 100 may be extended mapping data. The mapping data controller 210 may compare the extended mapping data received from the host 300 with the mapping data Mapping_DATA received from the memory device 100, and may then output one of them to the host 300.

The memory controller 200 may include a bitmap information generator 220. The bitmap information generator 220 may receive the data generation information DG_INF from the mapping data controller 210. The data generation information DG_INF may include information indicating that the extended mapping data has been generated. The data generation information DG_INF may include information about a logical block address (LBA) included in the extended mapping data.

When receiving the data generation information DG_INF, the bitmap information generator 220 may generate bitmap information BM_INF based on the data generation information DG_INF. The bitmap information BM_INF may be generated to include information about the logical block address (LBA) included in the extended mapping data. Therefore, the bitmap information BM_INF may be information to distinguish the extended mapping data from the normal mapping data. The bitmap information BM_INF may be for changing the bit value BIT_VAL included in the bitmap stored in the memory device 100. When receiving the bitmap information BM_INF, the memory device 100 may change the bit value BIT_VAL included in the bitmap.

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, a page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a Low Power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, features and aspects of the invention are described in the context in which the memory device 100 is a NAND flash memory.

In an embodiment, the memory device 100 may be implemented as a three-dimensional (3D) array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, each of the memory cells included in the memory device 100 may be implemented as a Single-Level Cell (SLC) in which one data bit is stored. Alternatively, each of the memory cells included in the memory device 100 may be implemented as a Multi-level Cell (MLC) in which two data bits are stored, a Triple-Level Cell (TLC) in which three data bits are stored, or a Quad-Level Cell (QLC) in which four data bits are stored.

The memory device 100 may receive a command and an address from the memory controller 200, and may access the area of the memory cell array, selected by the address. That is, the memory device 100 performs an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory device 100 may perform a program operation or an erase operation using a set operating voltage under the control of the memory controller 200.

The memory device 100 may include a mapping data storage 130. The mapping data storage 130 may receive the mapping data Mapping_DATA from the mapping data controller 210. The mapping data Mapping_DATA received from the mapping data controller 210 may be normal mapping data or extended mapping data. The mapping data storage 130 may store the mapping data Mapping_DATA received from the mapping data controller 210. The mapping data storage 130 may output the stored mapping data Mapping_DATA in response to a request from the memory controller 200.

In an embodiment, when the number of pieces of mapping data Mapping_DATA establishing mapping relationships with a single logical block address (LBA) is 2, the mapping data storage 130 may output extended mapping data.

In detail, when extended mapping data is stored in the mapping data storage 130, the number of pieces of mapping data Mapping_DATA for a single logical block address (LBA) may be 2. That is, the extended mapping data and the normal mapping data, corresponding to a single logical block address (LBA), may be stored in the mapping data storage 130. The mapping data storage 130 may output the extended mapping data to be compared with the mapping data Mapping_DATA, received by the mapping data controller 210 from the host 300. Alternatively, the mapping data storage 130 may output the extended mapping data so as to store the extended mapping data in the host memory 310. Also, since the extended mapping data is generated later than normal mapping data, the extended mapping data that is output is the latest, i.e., most recently stored, mapping data.

The memory device 100 may include a bitmap storage 150 that may store a bitmap. The bitmap may include a bit value BIT_VAL indicating that the mapping data Mapping_DATA is extended mapping data. In detail, the bitmap may have a bit value BIT_VAL corresponding to a mapping data group MD_Group. The mapping data group may be composed of a plurality of pieces of mapping data having the same mapping data type.

The bit value BIT_VAL included in the bitmap may be set to a default value. The default value may be "0" or "1". In an embodiment, when receiving the bitmap information BM_INF from the bitmap information generator 220, the bitmap storage 150 may change the bit value BIT_VAL of the bitmap from the default value to a specific value. In an embodiment, when the default value is "0", the bit value BIT_VAL may be changed from "0" to "1" after the bitmap information BM_INF has been received. In an embodiment, when the default value is "1", the bit value BIT_VAL may be changed from "1" to "0" after the bitmap information BM_INF has been received. When the bit value BIT_VAL is changed, the bitmap may indicate that pieces of mapping data included in the mapping data group corresponding to the changed bit value BIT_VAL are pieces of extended mapping data.

In an embodiment, the memory controller 200 may receive data and a logical block address (LBA) from the host 300, and may translate the logical block address (LBA) into a physical block address (PBA) indicating the address of memory cells in which the data is to be stored. Further, the memory controller 200 may store mapping information, which establishes mapping relationships between logical block addresses (LBA) and physical block addresses (PBA), in the buffer memory.

The memory controller 200 may control the memory device 100 so that a program operation, a read operation or an erase operation is performed in response to a request received from the host 300. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data without receiving a request from the host 300, and may transmit the generated program command, address, and data to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 using an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The host 300 may include the host memory 310. The host memory 310 may store the mapping data Mapping_DATA received from the mapping data controller 210. The mapping data Mapping_DATA received from the mapping data controller 210 may be extended mapping data.

When outputting a read request, the host 300 may output the extended mapping data together with the read request. The read request may be a read request for specific data stored in the memory device 100. The extended mapping data may include mapping data Mapping_DATA corresponding to the read request. When the host 300 outputs the extended mapping data to the memory controller 200, the memory controller 200 may decide whether to utilize the extended mapping data. The memory controller 200 may decide whether to utilize the extended mapping data based on the data included in the additional field of the extended mapping data.

Figure 2:
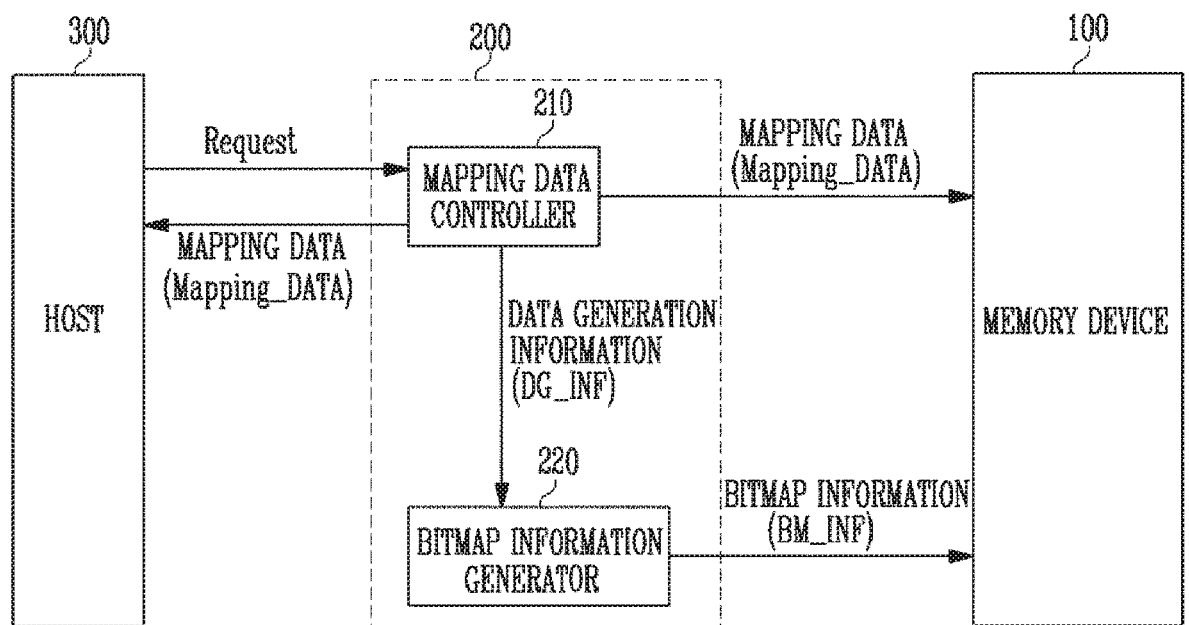
FIG. 2 is a diagram illustrating a configuration of a memory controller, such as that of FIG. 1, and a method of generating normal mapping data and extended mapping data.

FIG. 2 is a diagram illustrating an exemplary configuration of the memory controller 200 of FIG. 1 and a method of generating normal mapping data and extended mapping data.

Referring to FIG. 2, the memory controller 200 may include the mapping data controller 210 and the bitmap information generator 220.

The mapping data controller 210 may receive a request from the host 300. The mapping data controller 210 may generate mapping data Mapping_DATA in response to the request received from the host 300. In an embodiment, the request received from the host 300 may be an extended mapping data request or a normal mapping data request.

In detail, when the request received from the host 300 is the normal mapping data request, the mapping data controller 210 may generate normal mapping data. The normal mapping data may indicate mapping relationships between logical block addresses (LBA) and physical block addresses (PBA). The normal mapping data may not include an additional field. The mapping data controller 210 may output the normal mapping data to a memory device 100. In an embodiment, the memory device 100 may receive the normal mapping data, and may store the normal mapping data in a mapping data storage 130.

When the request received from the host 300 is an extended mapping data request, the mapping data controller 210 may additionally generate extended mapping data. That is, when receiving the extended mapping data request, the mapping data controller 210 may generate normal mapping data, and may then additionally generate the extended mapping data. The extended mapping data may be mapping data Mapping_DATA including the logical block address (LBA) included in a hot data. The hot data includes a plurality of logical block addresses. The hot data may be determined based on the frequency with which the host 300 outputs a specific logical block address to memory controller 200. In an embodiment, the host 300 may set the hot data.

The extended mapping data may include normal mapping data and the additional field. In the additional field, the number of updates of the corresponding extended mapping data or data required for error correction to a read data from a memory device (e.g. BCH (Bose-Chaudhuri-Hocquenghem) code or LDPC (Low-Density Parity-Check) code, etc.) may be stored.

In an embodiment, when the mapping data controller 210 generates the extended mapping data in response to a request from the host 300, it may output the extended mapping data to the host 300 and the memory device 100. The host 300 may store the extended mapping data, received from the mapping data controller 210, in the host memory 310. In an embodiment, the memory device 100 may store the extended mapping data, received from the mapping data controller 210, in the mapping data storage 130.

In an embodiment, when generating extended mapping data in response to the request from the host 300, the mapping data controller 210 may generate and output data generation information DG_INF. The data generation information DG_INF may include information indicating that the extended mapping data has been generated. Also, the data generation information DG_INF may include information about a logical block address (LBA) included in the extended mapping data. Also, the data generation information DG_INF may indicate that mapping information corresponding to a logical block address (LBA) included in the extended mapping data has been generated.

That is, in order to indicate that the mapping data corresponding to a specific logical block address (LBA) has been generated, the data generation information DG_INF may be generated.

The bitmap information generator 220 may receive the data generation information DG_INF from the mapping data controller 210. When the extended mapping data is generated, the data generation information DG_INF may be output from the mapping data controller 210. When receiving the data generation information DG_INF, the bitmap information generator 220 may generate bitmap information BM_INF based on the data generation information DG_INF. The bitmap information BM_INF may include information to cause change of a bit value BIT_VAL that is stored in the bitmap storage 150 of the memory device.

In detail, the bitmap information BM_INF may include information for changing a bit value BIT_VAL corresponding to a mapping data group MD_Group from a default value to a specific value. The mapping data group MD_Group may include a plurality of pieces of normal mapping data or a plurality of pieces of extended mapping data. In an embodiment, the bitmap information BM_INF may be generated based on information about logical block addresses (LBA) respectively included in pieces of extended mapping data included in the mapping data group MD_Group. Therefore, the bitmap information BM_INF may be information to distinguish the extended mapping data from normal mapping data.

The bitmap information generator 220 may output the bitmap information BM_INF to the memory device 100. When the bitmap information BM_INF is received, the memory device 100 may change a bit value BIT_VAL corresponding to the mapping data group MD_Group that includes mapping information about a logical block address (LBA) included in the bitmap information BM_INF.

Based on the bitmap information BM_INF output from the bitmap information generator 220, the bit value BIT_VAL stored in the bitmap storage 150 of the memory device 100 may be changed from a default value to a specific value. The bit value BIT_VAL stored in the bitmap storage 150 is changed, and thus it may indicate that the mapping data Mapping_DATA, stored in the mapping data storage 130 of the memory device 100, is the extended mapping data. That is, in order to indicate that the extended mapping data has been generated, the bit value corresponding to the mapping data group may be stored in the memory device 100.

Figure 3:
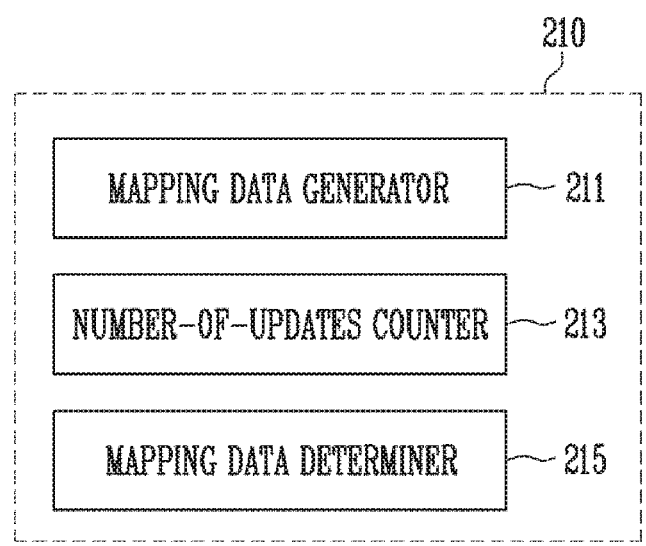
FIG. 3 is a block diagram illustrating a configuration of a mapping data controller, such as that of FIG. 2.

FIG. 3 is a block diagram illustrating an exemplary configuration of the mapping data controller 210 of FIG. 2.

Referring to FIG. 3, the mapping data controller 210 may include a mapping data generator 211, a number-of-updates counter 213, and a mapping data determiner 215. The mapping data controller 210 may include various components to generate mapping data Mapping_DATA in addition to the above-described components.

The mapping data controller 210 may include the mapping data generator 211. The mapping data generator 211 may generate mapping data Mapping_DATA in response to the request received from the host 300. The request received from the host 300 may be a normal mapping data request or an extended mapping data request.

When the mapping data generator 211 generates extended mapping data in response to the extended mapping data request, the mapping data generator 211 may output the extended mapping data to the host 300 and the memory device 100. In detail, the host memory 310 included in the host 300 may store the extended mapping data received from the mapping data generator 211. The mapping data storage 130 included in the memory device 100 may store the extended mapping data received from the mapping data generator 211.

The mapping data controller 210 may include the number-of-updates counter 213. The number-of-updates counter 213 may count the number of updates of the mapping data Mapping_DATA. In detail, the generation of new mapping data Mapping_DATA by the mapping data generator 211 may indicate that existing mapping data Mapping_DATA is updated.

Whenever the mapping data generator 211 generates mapping data Mapping_DATA in response to the request received from the host 300, the number-of-updates counter 213 may receive logical block address information LBA_INF and update information UPDATE_INF from the mapping data generator 211. The logical block address information LBA_INF may be information about a logical block address (LBA) included in the mapping data Mapping_DATA that is generated in response to the request received from the host 300. The update information UPDATE_INF may be output from the mapping data generator 211 when a mapping data generation request including the same logical block address as that included in previously generated mapping data is received.

The number-of-updates counter 213 may count the number of updates based on the logical block address information LBA_INF and the update information UPDATE_INF. The number-of-updates counter 213 may count the number of updates, that is, may count whenever update information UPDATE_INF is received for each logical block address (LBA) in the logical block address information LBA_INF. The number-of-updates counter 213 may count the number of updates of the mapping data Mapping_DATA for each logical block address (LBA).

The number-of-updates counter 213 may output the count information COUNT_INF including a count value indicative of the number of updates counted as described above. The count information COUNT_INF may include the number of updates of mapping data including the corresponding logical block address (LBA). The mapping data generator 211 may receive the count information COUNT_INF, and may store the number of updates in the additional field when extended mapping data is generated.

The mapping data controller 210 may include the mapping data determiner 215. The mapping data determiner 215 may receive a bit value BIT_VAL from the memory device 100. In detail, the mapping data determiner 215 may receive a bit value BIT_VAL included in a bitmap stored in the bitmap storage 150. The bit value BIT_VAL may indicate that the mapping data is extended mapping data.

FIG. 4 is a diagram for explaining normal mapping data.

Referring to FIG. 4, a mapping data controller 210 may generate normal mapping data in response to a request from a host 300. The request may be a normal mapping data request. The normal mapping data may be one of various mapping data, i.e., first to fourth mapping data Mapping_DATA1 to 4. The normal mapping data may include mapping information indicating mapping relationships between logical block addresses (LBA) and physical block addresses (PBA). The normal mapping data may not include an additional field.

That is, the mapping data controller 210 may generate the first to fourth mapping data Mapping_DATA1 to 4 in response to the normal mapping data request received from the host 300. In another embodiment, the mapping data controller 210 may generate more than four pieces of normal mapping data.

Each of the first to fourth pieces of mapping data Mapping_DATA1 to 4 may include mapping information indicating a mapping relationship between a logical block address (LBA) and a physical block address (PBA). In an embodiment, the first mapping data Mapping_DATA1 may include mapping information indicating a mapping relationship between a first logical block address (LBA1) and a first physical block address (PBA1). The second mapping data Mapping_DATA2 may include mapping information indicating a mapping relationship between a second logical block address (LBA2) and a second physical block address (PBA2). The third mapping data Mapping_DATA3 may include mapping information indicating a mapping relationship between a third logical block address (LBA3) and a third physical block address (PBA3). The fourth mapping data Mapping_DATA4 may include mapping information indicating a mapping relationship between a fourth logical block address (LBA4) and a fourth physical block address (PBA4).

In an embodiment, the mapping data controller 210 may generate the normal mapping data and then generate extended mapping data. In detail, when the request received from the host 300 is an extended mapping data request, the mapping data controller 210 may additionally generate extended mapping data. The extended mapping data request may be a request to generate mapping data Mapping_DATA including the logical block address (LBA) included in a hot data.

The mapping data controller 210 may output the normal mapping data to the memory device 100. In an embodiment, the memory device 100 may receive the normal mapping data, and may store the normal mapping data in a mapping data storage 130.

FIG. 5 is a diagram for explaining generation of extended mapping data.

Referring to FIG. 5, the mapping data controller 210 may generate the extended mapping data in response to the request received from the host 300. The received request may be the extended mapping data request. The extended mapping data may be one of various mapping data, i.e., Mapping_DATA2a, Mapping_DATA4a. The extended mapping data request may be a request to generate mapping data Mapping_DATA including the logical block address (LBA) included in a hot data.

The extended mapping data may include an additional field and mapping information indicating mapping relationships between logical block addresses (LBA) and physical block addresses (PBA). The normal mapping data may include mapping information indicating mapping relationships between logical block addresses (LBA) and physical block addresses (PBA). That is, the extended mapping data may include the normal mapping data and the additional field.

When the extended mapping data request is received, the mapping data controller 210 may generate normal mapping data, and may thereafter additionally generate extended mapping data. That is, when an extended mapping data generation request including a second logical block address (LBA2), which is the logical block address included in the hot data, is received, the mapping data controller 210 may generate extended mapping data corresponding to the second logical block address (LBA2) after generating normal mapping data corresponding to the second logical block address (LBA2). Therefore, the mapping data controller 210 may generate second mapping data Mapping_DATA2, which is normal mapping data, and thereafter generate 2a-th mapping data Mapping_DATA2a, which is extended mapping data.

In an embodiment, when an extended mapping data generation request including a fourth logical block address (LBA4), which is an additional logical block address included in the hot data, is received, the mapping data controller 210 may generate fourth mapping data Mapping_DATA4, which is normal mapping data corresponding to the fourth logical block address (LBA4), and thereafter generate 4a-th mapping data Mapping_DATA4a, which is extended mapping data corresponding to the fourth logical block address (LBA4).

The mapping data controller 210 may generate the extended mapping data, i.e., 2a-th and 4a-th mapping data Mapping_DATA2a and Mapping_DATA4a in response to the extended mapping data request received from the host 300. In an embodiment, the mapping data controller 210 may generate a larger number of pieces of extended mapping data.

Each of the 2a-th mapping data Mapping_DATA2a and the 4a-th mapping data Mapping_DATA4a may include the corresponding additional field k2a or k4a and mapping information indicating a mapping relationship between a logical block address (LBA) and a physical block address (PBA). In an embodiment, each of the 2a-th mapping data Mapping_DATA2a and the 4a-th mapping data Mapping_DATA4a may include normal mapping data and an additional field.

That is, the 2a-th mapping data Mapping_DATA2a may include the additional field k2a and mapping information indicating a mapping relationship between the second logical block address (LBA2) and the second physical block address (PBA2). The 4a-th mapping data Mapping_DATA4a may include the additional field k4a and mapping information indicating the mapping relationship between the fourth logical block address (LBA4) and the fourth physical block address (PBA4). The additional fields k2a and k4a in the 2a-th mapping data Mapping_DATA2a and the 4a-th mapping data Mapping_DATA4a respectively, may store the number of updates of the associated extended mapping data or data required for error correction.

In an embodiment, when the number of updates of extended mapping data is stored in the corresponding additional field, the mapping data controller 210 may determine mapping data Mapping_DATA to be output to the memory device 100 based on the data stored in the additional field. In an embodiment, when data for correcting errors included in a read data from a memory device (e.g. BCH (Bose-Chaudhuri-Hocquenghem) code or LDPC (Low-Density Parity-Check) code, etc.) is included in the additional field in the extended mapping data, the memory controller 200 may perform an operation of correcting errors occurring in the extended mapping data based on the data stored in the additional field.

In an embodiment, when the mapping data controller 210 generates the extended mapping data in response to a request from the host 300, the mapping data controller 210 may output the extended mapping data to the host 300 and the memory device 100. The host 300 may store the extended mapping data, received from the mapping data controller 210, in the host memory 310. In an embodiment, the memory device 100 may store the extended mapping data, received from the mapping data controller 210, in the mapping data storage 130.

FIG. 6 is a diagram illustrating a method of generating the extended mapping data in which the number of updates of mapping data is stored in an additional field.

Referring to FIG. 6, the mapping data controller 210 may include the mapping data generator 211 and the number-of-updates counter 213. In FIG. 6, the mapping data determiner 215 that may be included in the mapping data controller 210 is omitted for clarity. The mapping data generator 211 may generate normal mapping data or extended mapping data in response to a request from the host 300. The number-of-updates counter 213 may count the number of times that mapping data Mapping_DATA is updated, that is, the number of updates of mapping data Mapping_DATA.

In detail, the mapping data generator 211 may receive a request from the host 300. The received request may be a normal mapping data request or an extended mapping data request. The normal mapping data request may be a request to generate mapping data Mapping_DATA including logical block addresses (LBA) included in a non-hot data. The extended mapping data request may be a request to generate mapping data Mapping_DATA including the logical block address (LBA) included in the hot data. The mapping data generator 211 may generate mapping data Mapping_DATA corresponding to the request.

The request received from the host 300 may include information about a logical block address (LBA), which may be logical block address information LBA_INF. The logical block address information LBA_INF may be information about the logical block address (LBA) included in the mapping data Mapping_DATA that is generated in response to the request received from the host 300.

The mapping data generator 211 may output the logical block address information LBA_INF and update information UPDATE_INF to the number-of-updates counter 213 in response to the request received from the host 300. The logical block address information LBA_INF may be information about the logical block address (LBA) included in the mapping data Mapping_DATA that is generated in response to the request received from the host 300.

The mapping data generator 211 may generate update information UPDATE_INF and output the update information UPDATE_INF to the number-of-updates counter 213 in response to the request received from the host 300. When a request to generate mapping data Mapping_DATA including the same address as a logical block address (LBA) included in previously generated mapping data Mapping_DATA is received, the update information UPDATE_INF may be generated.

Therefore, the update information UPDATE_INF may indicate that new mapping data Mapping_DATA for the same logical block address (LBA) has been generated in response to the request received from the host 300. That is, the update information UPDATE_INF may indicate that the mapping data Mapping_DATA including the same logical block address (LBA) has been updated.

As the logical block address information LBA_INF is received, the number-of-updates counter 213 may count the number of times that the update information UPDATE_INF is received for each logical block address (LBA) to generate a cumulative count. In detail, the number of times that the number-of-updates counter 213 receives the update information UPDATE_INF may indicate the number of updates of mapping data Mapping_DATA including mapping relationships between logical block addresses (LBA) and physical block addresses (PBA). Therefore, the number-of-updates counter 213 may count the number of updates of the mapping data Mapping_DATA for each logical block address (LBA).

The number-of-updates counter 213 may count the number of updates of the mapping data Mapping_DATA regardless of the type of the request received from the host 300. The type of the request received from the host 300 may be a request to generate mapping data Mapping_DATA including the logical block addresses (LBA) included in a non-hot data or a request to generate mapping data Mapping_DATA including the logical block address (LBA) included in the hot data. That is, since the non-hot data can be changed to the hot data or, vice versa, there is a need to count the number of updates of the mapping data Mapping_DATA regardless of the type of the request received from the host 300.

The number-of-updates counter 213 may output count information COUNT_INF, generated by counting the number of updates of the mapping data Mapping_DATA, to the mapping data generator 211. The count information COUNT_INF may include information about the number of updates of the mapping data Mapping_DATA. Therefore, the number-of-updates counter 213 may output the count information COUNT_INF for each logical block address (LBA).

The mapping data generator 211 may generate mapping data Mapping_DATA based on the request received from the host 300 and the count information COUNT_INF.

In detail, the request received from the host 300 may be a normal mapping data request. The normal mapping data request may be a request to generate mapping data Mapping_DATA including logical block addresses (LBA) included in a non-hot data. The mapping data generator 211 may generate normal mapping data Mapping_DATA in response to the normal mapping data request received from the host 300. That is, the mapping data generator 211 may generate mapping data Mapping_DATA that does not include an additional field. In this case, the mapping data generator 211 may ignore the count information COUNT_INF received from the number-of-updates counter 213.

The request received from the host 300 may be an extended mapping data request. The extended mapping data request may be a request to generate mapping data Mapping_DATA including the logical block address (LBA) included in the hot data. The mapping data generator 211 may generate extended mapping data in response to the extended mapping data request received from the host 300. That is, the mapping data generator 211 may generate mapping data Mapping_DATA that includes an additional field. In this case, the mapping data generator 211 may generate mapping data Mapping_DATA in which the count information COUNT_INF received from the number-of-updates counter 213 is stored in the additional field. The count information COUNT_INF may include information about the number of updates of the mapping data Mapping_DATA.

FIG. 7 is a diagram for explaining a bitmap stored in the memory device of FIG. 1.

Referring to FIGS. 4, 5, and 7, the mapping data controller 210 may generate normal mapping data or extended mapping data in response to a request received from the host 300.

That is, the type of the mapping data generated by the mapping data controller 210 may be normal mapping data or extended mapping data.

The normal mapping data may be generated when the request received from the host 300 is a normal mapping data request. In detail, the normal mapping data may be generated when a request to generate mapping data Mapping_DATA including logical block addresses (LBA) included in a non-hot data is received from the host 300.

The extended mapping data may be generated when the request received from the host 300 is an extended mapping data request. That is, the extended mapping data may be generated when a request to generate mapping data Mapping_DATA including the logical block address (LBA) included in the hot data is received from the host 300.

A plurality of pieces of normal mapping data and a plurality of pieces of extended mapping data may be divided into a plurality of mapping data groups. Each of the mapping data groups may include multiple pieces of one type, i.e., normal or extended, mapping data. Each of the mapping data groups may include the same number of pieces of mapping data.

In FIG. 7, first to fourth pieces mapping data Mapping_DATA1 to 4 are normal mapping data. Each of the first to fourth pieces of mapping data Mapping_DATA1 to 4 may include mapping information indicating a mapping relationship between a logical block address (LBA) and a physical block address (PBA). In another embodiment, more than four pieces of normal mapping data may be generated.

The first to fourth pieces of mapping data Mapping_DATA1 to 4 may be divided into a first mapping data group and a second mapping data group MD_Group1 and MD_Group2. In an embodiment, the first mapping data group MD_Group1 may include two pieces of mapping data: Mapping_DATA1 and Mapping_DATA2, and the second mapping data group may include the third and fourth mapping data Mapping_DATA3 and Mapping_DATA4. The mapping data controller 210 may transmit the mapping data to the host 300 and/or the memory device 100 on a mapping data group basis.

Although, in FIG. 7, two pieces of mapping data are included in a single mapping data group, the present invention is not limited to that configuration; a single mapping data group may include more than two piece of mapping data.

2a-th mapping data Mapping_DATA2a and 4a-th mapping data and Mapping_DATA4a may be extended mapping data. Each of the 2a-th mapping data Mapping_DATA2a and the 4a-th mapping data Mapping_DATA4a may include an additional field and mapping information indicating a mapping relationship between a logical block address (LBA) and a physical block address (PBA). In another embodiment, more than two pieces of extended mapping data may be generated.

The 2a-th and 4a-th mapping data Mapping_DATA2a and Mapping_DATA4a may be included in a third mapping data group MD_Group3. In an embodiment, the third mapping data group MD_Group3 may include two pieces of mapping data, which is the same number of pieces of mapping data in each of the first and second mapping data groups MD_Group1 and MD_Group2.

The third mapping data group MD_Group3 may include the 2a-th and 4a-th mapping data Mapping_DATA2a and Mapping_DATA4a. The mapping data controller 210 may transmit the mapping data to the host 300 and/or the memory device 100 on a mapping data group basis.

The mapping data storage 130 included in the memory device 100 may store the normal mapping data or the extended mapping data received from the mapping data controller 210. The mapping data storage 130 may output the mapping data Mapping_DATA, stored in the mapping data storage 130, in response to a request from the memory controller 200. The mapping data storage 130 may output the mapping data on a mapping data group basis.

The memory device 100 may store a bitmap separately from the mapping data Mapping_DATA. The bitmap may be stored in the bitmap storage 150 included in the memory device 100. The bitmap may include a bit value BIT_VAL indicating that the mapping data Mapping_DATA is extended mapping data.

In detail, the bitmap may contain bit values BIT_VAL corresponding to respective mapping data groups MD_Group. The bit values BIT_VAL included in the bitmap may be set to a default value. The default value may be "0" or "1".

In FIG. 7, the default value is "0".

Therefore, when the normal mapping data or extended mapping data received from the mapping data controller 210 is stored in the mapping data storage 130, the bit values BIT_VAL corresponding to mapping data groups MD_Group including the pieces of mapping data may be set to "0". That is, the bit values BIT_VAL may be stored in the bitmap for respective mapping data groups MD_Group.

Consequently, initial bit values BIT_VAL in the bitmap for the respective mapping data groups MD_Groups may be set to "0". Therefore, all bit values BIT_VAL are "0" when initial mapping data Mapping_DATA is generated. That is, when the memory controller 200 generates the initial mapping data Mapping_DATA, the bitmap storage 150 may store the bitmap in which all bit values BIT_VAL are "0".

When bitmap information BM_INF is received from the bitmap information generator 220, the bitmap storage 150 may change the bit values BIT_VAL in the bitmap from the default value to a specific value. That is, the bitmap storage 150 may receive the bitmap information BM_INF from the memory controller 200 and then store the bitmap.

The bitmap information BM_INF may be generated based on data generation information DG_INF received from the mapping data controller 210. The bitmap information BM_INF may be information for indicating that the mapping data Mapping_DATA generated by the mapping data controller 210 is extended mapping data. The bitmap information BM_INF may be generated to include information about the logical block address (LBA) included in the extended mapping data. Therefore, the bitmap information BM_INF may be information to distinguish the extended mapping data from normal mapping data.

In an embodiment, since the default value is "0", the bitmap storage 150 may receive the bitmap information BM_INF, and thereafter change a bit value BIT_VAL corresponding to a mapping data group to which the extended mapping data belongs from "0" to "1". In detail, the bitmap storage 150 may change the bit value BIT_VAL corresponding to the extended mapping data from "0" to "1". When the bit value BIT_VAL is changed, the bitmap may indicate that mapping data Mapping_DATA included in the mapping data group having the changed bit value BIT_VAL is the extended mapping data.

In an embodiment, the bitmap storage 150 may change the bit value BIT_VAL corresponding to the third mapping data group MD_Group3 from "0" to "1". The change of the bit value BIT_VAL may indicate that the 2a-th and 4a-th mapping data Mapping_DATA2a and Mapping_DATA4a are extended mapping data.

Consequently, when the memory controller 200 generates initial mapping data Mapping_DATA, the bitmap storage 150 may store the bitmap in which all bit values BIT_VAL are "0". Thereafter, the bitmap storage 150 may receive the bitmap information BM_INF from the memory controller 200 and store the bitmap in which bit values BIT_VAL corresponding to the bitmap information BM_INF are changed.

Figure 8:
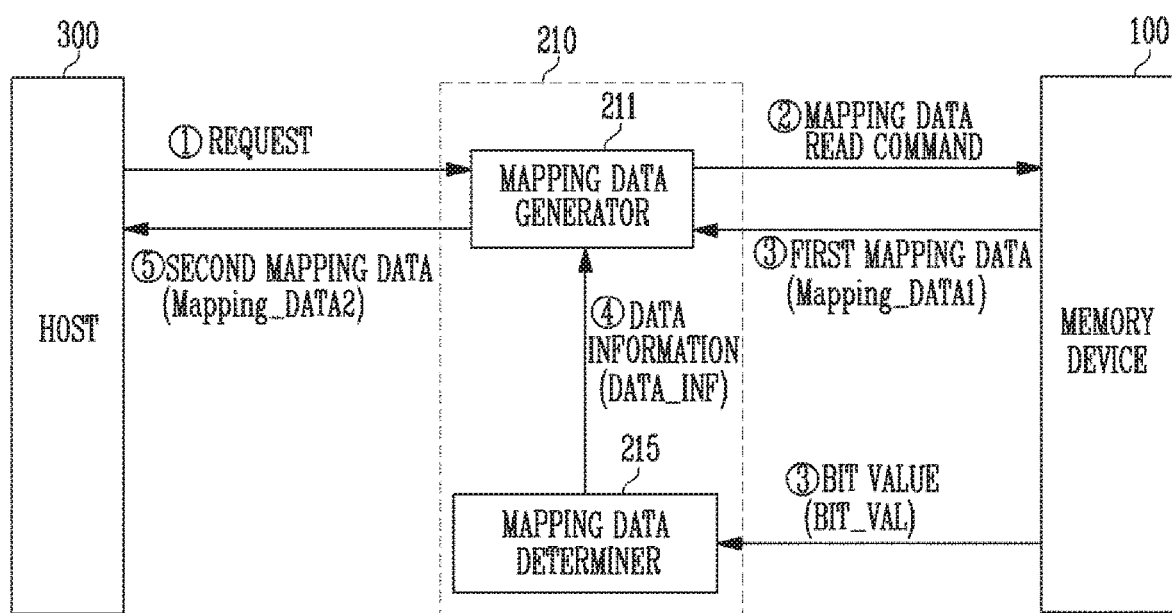
FIG. 8 is a diagram illustrating a method in which a memory controller outputs mapping data in response to a mapping data request from a host.

FIG. 8 is a diagram illustrating a method in which a memory controller, e.g., memory controller 200, outputs mapping data in response to a mapping data request from a host.

Referring to FIG. 8, the mapping data controller 210 may include the mapping data generator 211 and the mapping data determiner 215. In FIG. 8, the number-of-updates counter 213 included in the mapping data controller 210 is omitted for clarity. The mapping data generator 211 may generate normal mapping data or extended mapping data in response to a request from the host 300.

In detail, the mapping data generator 211 may receive the request from the host 300 (①). The received request may be a normal mapping data request or an extended mapping data request. The normal mapping data request may be a request to generate mapping data Mapping_DATA including logical block addresses (LBA) included in a non-hot data. The extended mapping data request may be a request to generate mapping data Mapping_DATA including the logical block address (LBA) included in the hot data.

In an embodiment, the mapping data generator 211 may output a mapping data read command to the memory device 100 in response to the request received from the host 300 (②).

In detail, the request received from the host 300 is a request to generate mapping data Mapping_DATA, and thus the mapping data generator 211 may perform an operation of checking whether previously generated mapping data is stored in the memory device 100. Therefore, the mapping data storage 211 may check, based on the request received from the host 300, whether mapping data Mapping_DATA including a logical block address (LBA) included in the request is stored in the memory device 100.

In an embodiment, the mapping data generator 211 may transmit a mapping data read command requesting to read the mapping data Mapping_DATA stored in the memory device 100. The memory device 100 may output the mapping data Mapping_DATA stored in the memory device 100 in response to the mapping data read command. The mapping data Mapping_DATA output from the memory device 100 may be first mapping data Mapping_DATA1. The first mapping data Mapping_DATA1 may include the logical block address (LBA) included in the request received from the host 300.

In an embodiment, when mapping data Mapping_DATA including a logical block address (LBA) included in the request received from the host 300 is not present in the memory device 100, the first mapping data Mapping_DATA1 may not be output.

In an embodiment, the memory device 100 may output the bit value BIT_VAL corresponding to the first mapping data Mapping_DATA1 to the mapping data determiner 215 while outputting the first mapping data Mapping_DATA1 to the mapping data generator 211 (③). The bit value BIT_VAL may be a value included in a bitmap stored in the bitmap storage 150. The bit value BIT_VAL may be "0" or "1". The bit value BIT_VAL may be a data value for distinguishing normal mapping data from extended mapping data.

Consequently, the memory device 100 may output the bit value BIT_VAL corresponding to the first mapping data group MD_Group1 to the mapping data determiner 215 while outputting pieces of mapping data included in the first mapping data group MD_Group1 including the first mapping data Mapping_DATA1 to the mapping data generator 211.

When the bit value BIT_VAL is received from the memory device 100, the mapping data determiner 215 may generate data information DATA_INF based on the bit value BIT_VAL, and may then output the generated data information DATA_INF to the mapping data generator 211 (④). The data information DATA_INF may indicate whether the first mapping data Mapping_DATA1 output from the memory device 100 is normal mapping data or extended mapping data.

The mapping data generator 211 may receive the data information DATA_INF from the mapping data determiner 215, and may then determine whether to generate extended mapping data.

In detail, even if the request received from the host 300 is a request to generate extended mapping data, first mapping data Mapping_DATA1 received from the memory device 100 may be normal mapping data. The normal mapping data may be identified through the data information DATA_INF.

In this case, the mapping data generator 211 may perform an operation of generating extended mapping data. When the extended mapping data is generated, the mapping data generator 211 may output second mapping data Mapping_DATA2 to the host 300 (⑤). The second mapping data Mapping_DATA2 may be the extended mapping data generated in response to the extended mapping data request received from the host 300.

In an embodiment, the request received from the host 300 may be a request to generate extended mapping data, and the first mapping data Mapping_DATA1 received from the memory device 100 may be extended mapping data. The extended mapping data may be identified through the data information DATA_INF.

In this case, the mapping data generator 211 may not perform an operation of generating extended mapping data. That is, the mapping data generator 211 may output second mapping data Mapping_DATA2 in response to the first mapping data Mapping_DATA1 received from the memory device 100 (⑤). The second mapping data Mapping_DATA2 may be the first mapping data Mapping_DATA1 received from the memory device 100. Therefore, the second mapping data Mapping_DATA2 output from the mapping data generator 211 may be the same as the first mapping data Mapping_DATA1.

Figure 9:
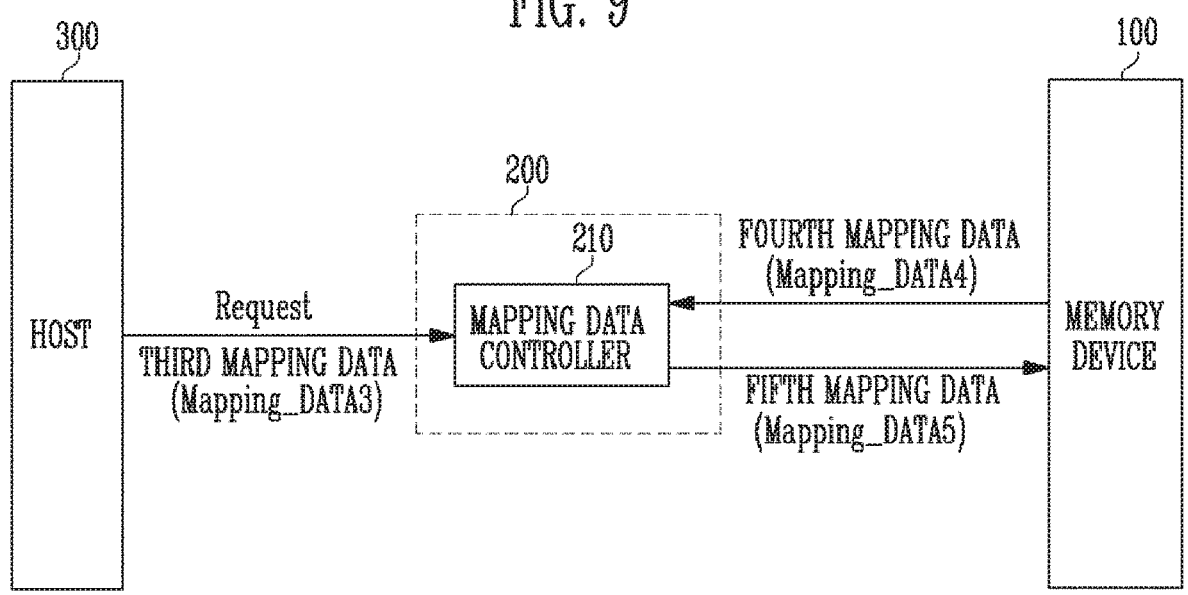
FIG. 9 is a diagram illustrating a method of outputting mapping data corresponding to a request from a host to a memory device, such as that of FIG. 1.

FIG. 9 is a diagram illustrating a method of outputting mapping data corresponding to a request from a host to the memory device of FIG. 1.

Referring to FIG. 9, the mapping data controller 210 may receive a request and mapping data Mapping_DATA from the host 300. The mapping data Mapping_DATA received from the host 300 may be extended mapping data. The extended mapping data may include normal mapping data and an additional field. The mapping data Mapping_DATA received from the host 300 may be third mapping data Mapping_DATA3. The request received from the host 300 may be a read request for data stored in the memory device 100. That is, when the read request is received from the host 300, the mapping data controller 210 may receive the extended mapping data, together with the read request, from the host 300.

The mapping data controller 210 may determine whether to utilize the third mapping data Mapping_DATA3 received from the host 300. In detail, the mapping data controller 210 may determine, based on data included in the additional field of the third mapping data Mapping_DATA3, whether to utilize the third mapping data Mapping_DATA3. The data included in the additional field of the third mapping data Mapping_DATA3 may be the number of updates of the third mapping data Mapping_DATA3.

The mapping data controller 210 may receive the mapping data Mapping_DATA stored in the memory device 100. The mapping data controller 210 may output a command requesting the mapping data Mapping_DATA, stored in the memory device 100, to the memory device 100 in response to the request received from the host 300. The memory device 100 may output the stored mapping data Mapping_DATA in response to the command requesting the mapping data Mapping_DATA. The mapping data Mapping_DATA, output from the memory device 100 to the mapping data controller 210, may be fourth mapping data Mapping_DATA4. The fourth mapping data Mapping_DATA4 may be extended mapping data, in which case it may include an additional field where the number of updates of the fourth mapping data Mapping_DATA4 may be stored.

The mapping data controller 210 may compare the third mapping data Mapping_DATA3 received from the host 300 with the fourth mapping data Mapping_DATA4 received from the memory device 100. The third mapping data Mapping_DATA3 may be mapping data Mapping_DATA corresponding to the request from the host 300. The fourth mapping data Mapping_DATA4 may be data corresponding to the command that is output from the mapping data controller 210 and that requests mapping data Mapping_DATA.

Third and fourth mapping data Mapping_DATA3 and Mapping_DATA4 may be extended mapping data. Each of the third mapping data Mapping_DATA3 and the fourth mapping data Mapping_DATA4 may include an additional field in which the number of updates is stored. The mapping data controller 210 may output fifth mapping data Mapping_DATA5 to the memory device 100 based on the numbers of updates stored in the additional fields of the third mapping data Mapping_DATA3 and the fourth mapping data Mapping_DATA4. The fifth mapping data Mapping_DATA5 may be the third mapping data Mapping_DATA3 or the fourth mapping data Mapping_DATA4. The memory device 100 may receive the fifth mapping data Mapping_DATA5, and may output data, stored at a physical block address (PBA) included in the fifth mapping data Mapping_DATA5, to the memory controller 200.

In an embodiment, the mapping data controller 210 may output the fifth mapping data Mapping_DATA5 to the memory device 100 based on the numbers of updates stored in the additional fields of the third and fourth mapping data Mapping_DATA3 and Mapping_DATA4. That is, when the number of updates stored in the additional field of the third mapping data Mapping_DATA3 is greater than the number of updates stored in the additional field of the fourth mapping data Mapping_DATA4, the third mapping data Mapping_DATA3 may be output as the fifth mapping data Mapping_DATA5. In contrast, when the number of updates stored in the additional field of the third mapping data Mapping_DATA3 is less than the number of updates stored in the additional field of the fourth mapping data Mapping_DATA4, the fourth mapping data Mapping_DATA4 may be output as the fifth mapping data Mapping_DATA5. When the number of updates stored in the additional field of the third mapping data Mapping_DATA3 is equal to the number of updates stored in the additional field of the fourth mapping data Mapping_DATA4, either of the third mapping data Mapping_DATA3 and the fourth mapping data Mapping_DATA4 may be output as the fifth mapping data Mapping_DATA5.

As a result, mapping data for which the number of updates is larger may be mapping data generated more recently than mapping data for which the number of updates is smaller. That is, the extended mapping data for which the number of updates is larger may be the most recently generated extended mapping data. Therefore, the mapping data controller 210 may output the extended mapping data for which the number of updates stored in the additional field is larger.

When the numbers of updates stored in the additional fields of pieces of extended mapping data are equal to each other, the mapping data received from the host 300 is identical to the mapping data received from the memory device 100, and thus the mapping data controller 210 may output any one of the pieces of received mapping data.

Figure 10:
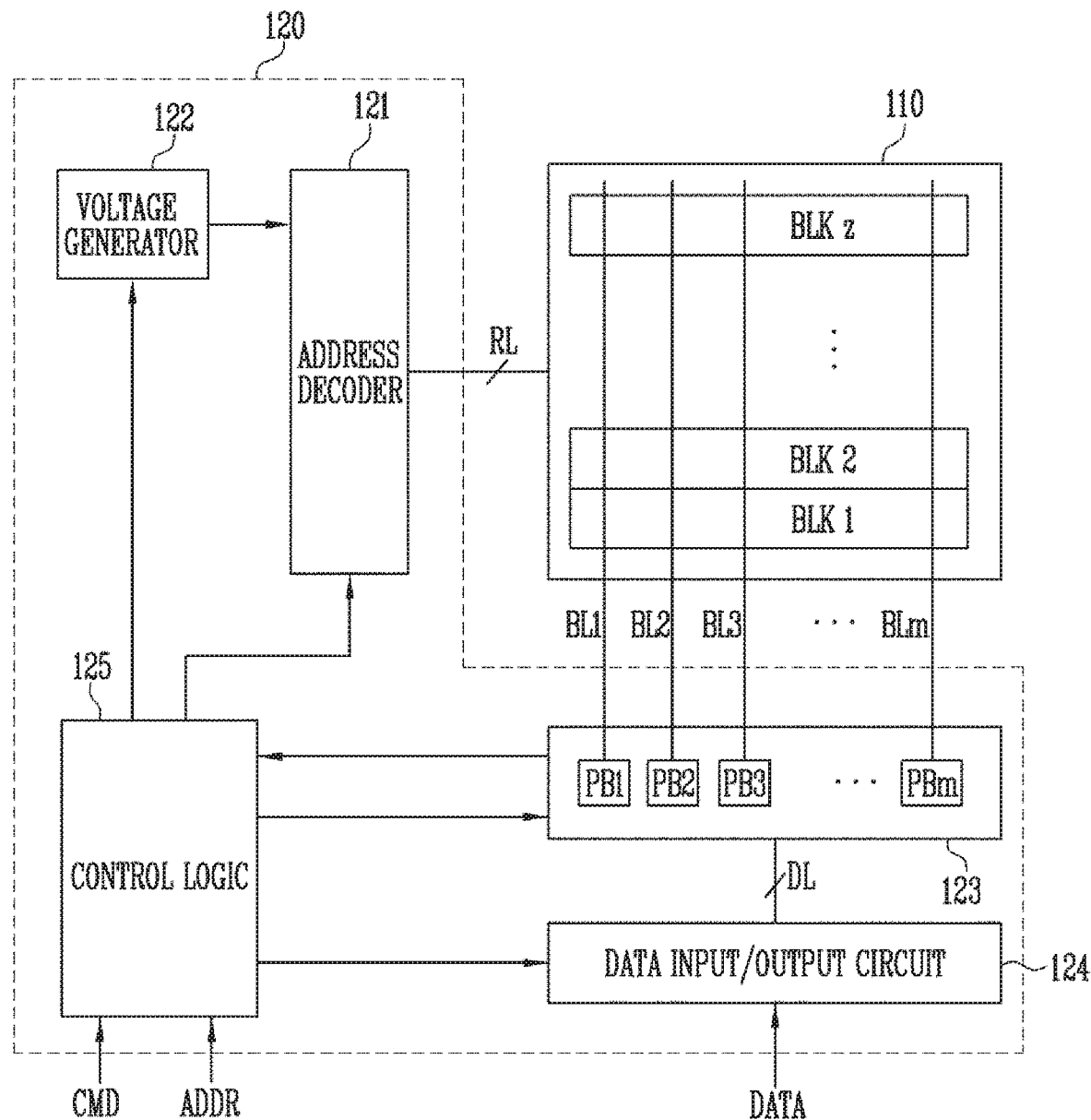
FIG. 10 is a block diagram illustrating an exemplary structure of the memory device of FIG. 1.

FIG. 10 is a block diagram illustrating an exemplary structure of the memory device of FIG. 1.

Referring to FIG. 10, a memory device 100 may include a memory cell array 110, a peripheral circuit 120, and control logic 125.

The memory cell array 110 includes a plurality of memory blocks BLK1 to BLKz. The memory blocks BLK1 to BLKz are coupled to an address decoder 121 through row lines RL and are coupled to a read and write circuit 123 through bit lines BL1 to BLm. Each of the memory blocks BLK1 to BLKz includes a plurality of memory cells. In an embodiment, the plurality of memory cells may be nonvolatile memory cells.

The memory cells may be divided into a plurality of blocks according to use or system considerations. System information corresponding to various types of setting information required to control the memory device 100 may be stored in the plurality of blocks.

Each of the first to z-th memory blocks BLK1 to BLKz includes a plurality of cell strings. First to m-th cell strings are respectively coupled to the first to m-th bit lines BL1 to BLm. Each of the first to m-th cell strings includes a drain select transistor, a plurality of series-coupled memory cells, and a source select transistor. The drain select transistor DST is coupled to a drain select line DSL. First to n-th memory cells are respectively coupled to first to n-th word lines WL1 to WLn. The source select transistor SST is coupled to a source select line SSL. A drain of the drain select transistor DST is coupled to the corresponding bit line. The drain select transistors of the first to m-th cell strings are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz. The drain select line DSL, the first to n-th word lines WL1 to WLn, and the source select line SSL are included in the row lines RL. The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read and write circuit 123.

The peripheral circuit 120 may include the address decoder 121, a voltage generator 122, the read and write circuit 123, a data input/output circuit 124, and the control logic 125.

The address decoder 121 is coupled to the memory cell array 110 through the row lines RL. The address decoder 121 may be operated under the control of the control logic 125. The address decoder 121 receives addresses ADDR through the control logic 125.

In an embodiment, the program operation and the read operation of the memory device 100 are each performed on a page basis.

During the program and read operations, the addresses ADDR received by the control logic 125 may include a block address and a row address. The address decoder 121 may decode the block address among the received addresses ADDR. The address decoder 121 selects one of the memory blocks BLK1 to BLKz in response to the decoded block address.

The address decoder 121 may decode the row address among the received addresses ADDR. In response to the decoded row address, the address decoder 121 applies voltages, provided from the voltage generator 122, to the row lines RL and then selects one word line of the selected memory block.

During an erase operation, the addresses ADDR include a block address. The address decoder 121 may decode the block address and select a memory block in response to the decoded block address. An erase operation may be performed on all or part of the selected memory block.

During a partial erase operation, the addresses ADDR may include block and row addresses. The address decoder 121 selects one of the memory blocks BLK1 to BLKz in response to the decoded block address.

The address decoder 121 may decode the row addresses among the received addresses ADDR. In response to the decoded row addresses, the address decoder 121 applies voltages, provided from the voltage generator 122, to the row lines RL and then selects at least one word line of the selected memory block.

In an embodiment, the address decoder 121 may include a block decoder, a word line decoder, an address buffer, etc.

The voltage generator 122 may generate a plurality of voltages using an external supply voltage provided to the memory device 100. The voltage generator 122 is operated under the control of the control logic 125.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively enabling the plurality of pumping capacitors under the control of the control logic 125. The generated voltages are applied to word lines selected by the address decoder 121.

During a program operation, the voltage generator 122 may generate a high-voltage program pulse and a pass pulse lower than the program pulse. During a read operation, the voltage generator 122 may generate a read voltage and a pass voltage higher than the read voltage. During an erase operation, the voltage generator 122 may generate an erase voltage.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 125.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data, received through the data input/output circuit 124, to selected memory cells through the bit lines BL1 to BLm when a program pulse is applied to each selected word line. The memory cells in the selected page are programmed based on the transferred data. Memory cells coupled to a bit line to which a program permission voltage (e.g., a ground voltage) is applied may have increased threshold voltages. Threshold voltages of memory cells coupled to a bit line to which a program inhibition voltage (e.g., a supply voltage) is applied may be maintained. During a program verify operation, the first to m-th page buffers may read page data from the selected memory cells through the bit lines BL1 to BLm.

During a read operation, the read and write circuit 123 may read data from the memory cells in the selected page through the bit lines BL, and may output the read data to the data input/output circuit 124. During an erase operation, the read and write circuit 123 may allow the bit lines BL to float.

In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 125. During a program operation, the data input/output circuit 124 receives data DATA to be stored from an external controller (not illustrated).

The control logic 125 is coupled to the address decoder 121, the voltage generator 122, the read and write circuit 123, and the data input/output circuit 124. The control logic 125 may control the overall operation of the memory device 100. The control logic 125 receives a command CMD and addresses ADDR from the external controller. The control logic 125 may control the address decoder 121, the voltage generator 122, the read and write circuit 123, and the data input/output circuit 124 in response to the command CMD.

Figure 11:
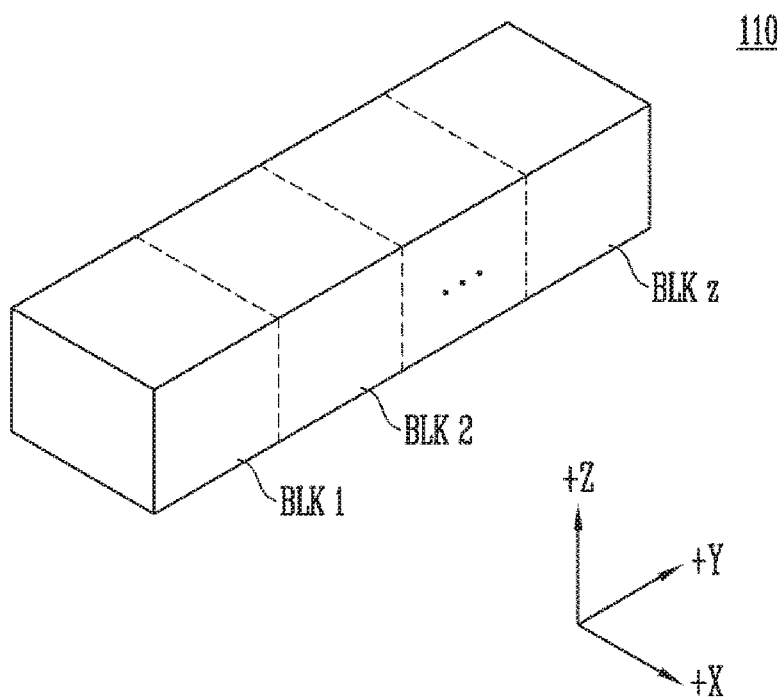
FIG. 11 is a diagram illustrating an embodiment of a memory cell array of FIG. 10.

FIG. 11 is a diagram illustrating an embodiment of the memory cell array of FIG. 10.

Referring to FIG. 11, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 12 and 13.

Figure 12:
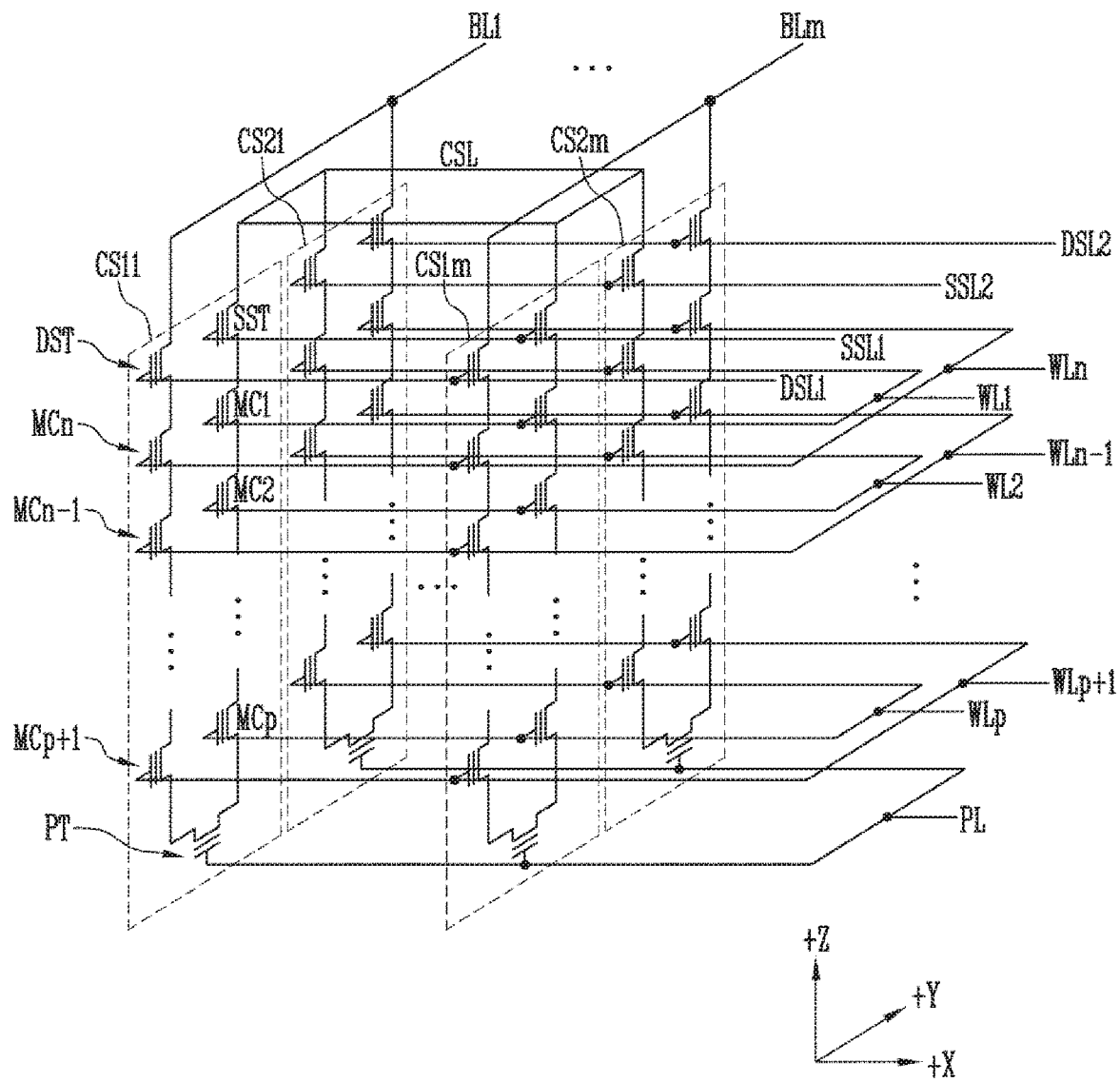
FIG. 12 is a circuit diagram illustrating an exemplary memory block BLKa of memory blocks BLK1 to BLKz of FIG. 11.

FIG. 12 is a circuit diagram illustrating a representative memory block BLKa of the memory blocks BLK1 to BLKz of FIG. 11.

Referring to FIG. 12, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 12, two cell strings are illustrated as being arranged in a column direction (i.e. a positive (+) Y direction). However, this illustration is for clarity; three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 12, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 12, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer dummy memory cells are provided, the size of the memory block BLKa is reduced, but the reliability of the operation of the memory block BLKa may be deteriorated.

In order to efficiently control the dummy memory cell(s), each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 13:
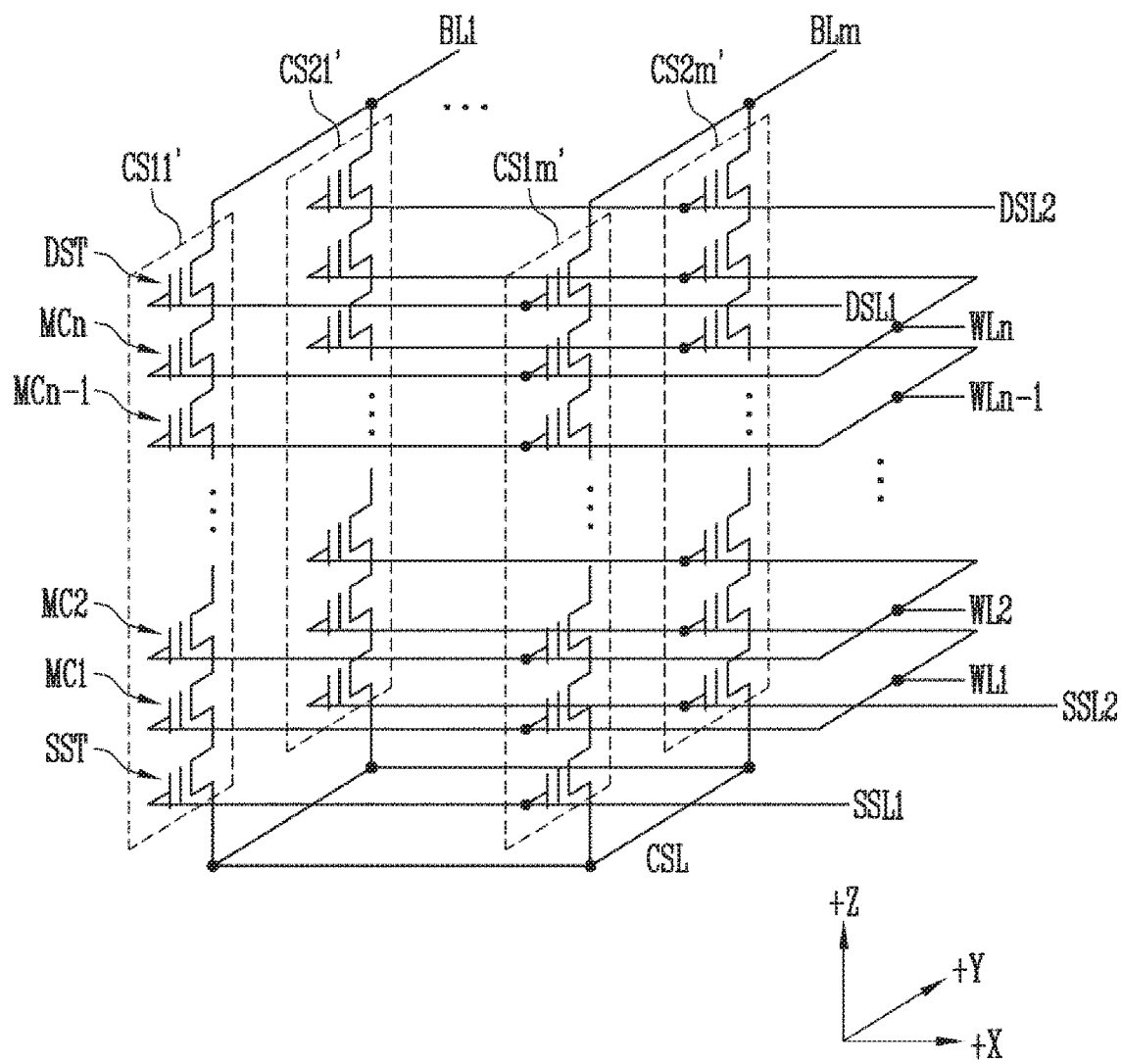
FIG. 13 is a circuit diagram illustrating an exemplary memory block BLKb of the memory blocks BLK1 to BLKz of FIG. 11.

FIG. 13 is a circuit diagram illustrating an example of a representative memory block BLKb of the memory blocks BLK1 to BLKz of FIG. 11.

Referring to FIG. 13, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 13 has an circuit similar or equivalent to that of the memory block BLKa of FIG. 12 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the dummy memory cell(s), each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 14:
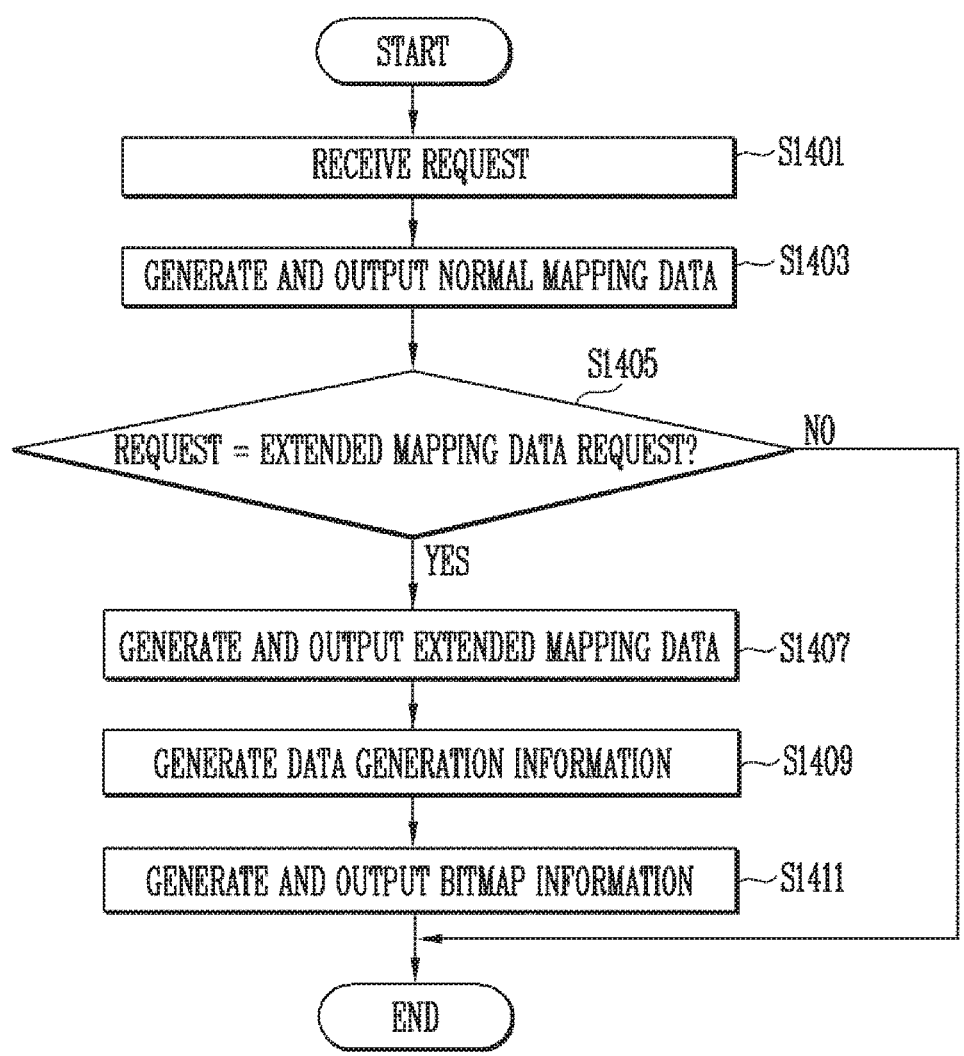
FIG. 14 is a flowchart illustrating operation of a memory controller in accordance with an embodiment of the present disclosure.

FIG. 14 is a flowchart illustrating the operation of a memory controller, e.g., memory controller 200, in accordance with an embodiment of the present disclosure.

Referring to FIG. 14, the mapping data controller 210 may receive a request from the host 300 at step S1401. The received request may be a normal mapping data request or an extended mapping data request. The normal mapping data request may be a request to generate mapping data Mapping_DATA including logical block addresses (LBA) of an area other than a hot data. The extended mapping data request may be a request to generate mapping data Mapping_DATA including the logical block address (LBA) included in the hot data. When the normal mapping data request or the extended mapping data request is received from the host 300, the mapping data controller 210 may generate mapping data Mapping_DATA.

At step S1403, the mapping data controller 210 may generate and output normal mapping data. That is, regardless of whether the request received from the host 300 is a normal mapping data request or an extended mapping data request, the normal mapping data may be generated and output. Therefore, when the normal mapping data request or the extended mapping data request is received from the host 300, the mapping data controller 210 may generate normal mapping data.

The normal mapping data may include mapping information indicating mapping relationships between logical block addresses (LBA) and physical block addresses (PBA). The normal mapping data may not include an additional field.

At step S1405, the mapping data controller 210 may determine whether the request received from the host 300 is an extended mapping data request. When it is, the process proceeds to step S1407. When the request received from the host 300 is not an extended mapping data request, the request received from the host 300 may be a normal mapping data request.

At step S1407, the mapping data controller 210 may generate and output extended mapping data. The extended mapping data may be generated in response to the extended mapping data request received from the host 300. The extended mapping data may be mapping data Mapping_DATA including the logical block address (LBA) included in a hot data. The hot data may be determined based on the frequency with which the host 300 accesses a specific area of the memory controller 200. In an embodiment, the host 300 may set the hot data.

At step S1409, the mapping data controller 210 may generate data generation information DG_INF. The data generation information DG_INF may include information indicating that the extended mapping data has been generated. Also, the data generation information DG_INF may include information about a logical block address (LBA) included in the extended mapping data. Also, the data generation information DG_INF may indicate that mapping information corresponding to a logical block address (LBA) included in the extended mapping data has been generated.

That is, in order to indicate that the mapping data corresponding to a specific logical block address (LBA) has been generated, the data generation information DG_INF may be generated.

At step S1411, the bitmap information generator 220 may generate and output bitmap information BM_INF. In detail, when the bitmap information generator 220 receives the data generation information DG_INF from the mapping data controller 210, the bitmap information generator 220 may generate bitmap information BM_INF based on the data generation information DG_INF. The bitmap information BM_INF may be generated to include information about the logical block address (LBA) included in the extended mapping data.

Therefore, the bitmap information BM_INF may be information to distinguish the extended mapping data from normal mapping data. The bitmap information BM_INF may be information for changing a bit value BIT_VAL included in a bitmap stored in the memory device 100. When the bitmap information BM_INF is received, the memory device 100 may change the bit value BIT_VAL included in the bitmap.

Figure 15:
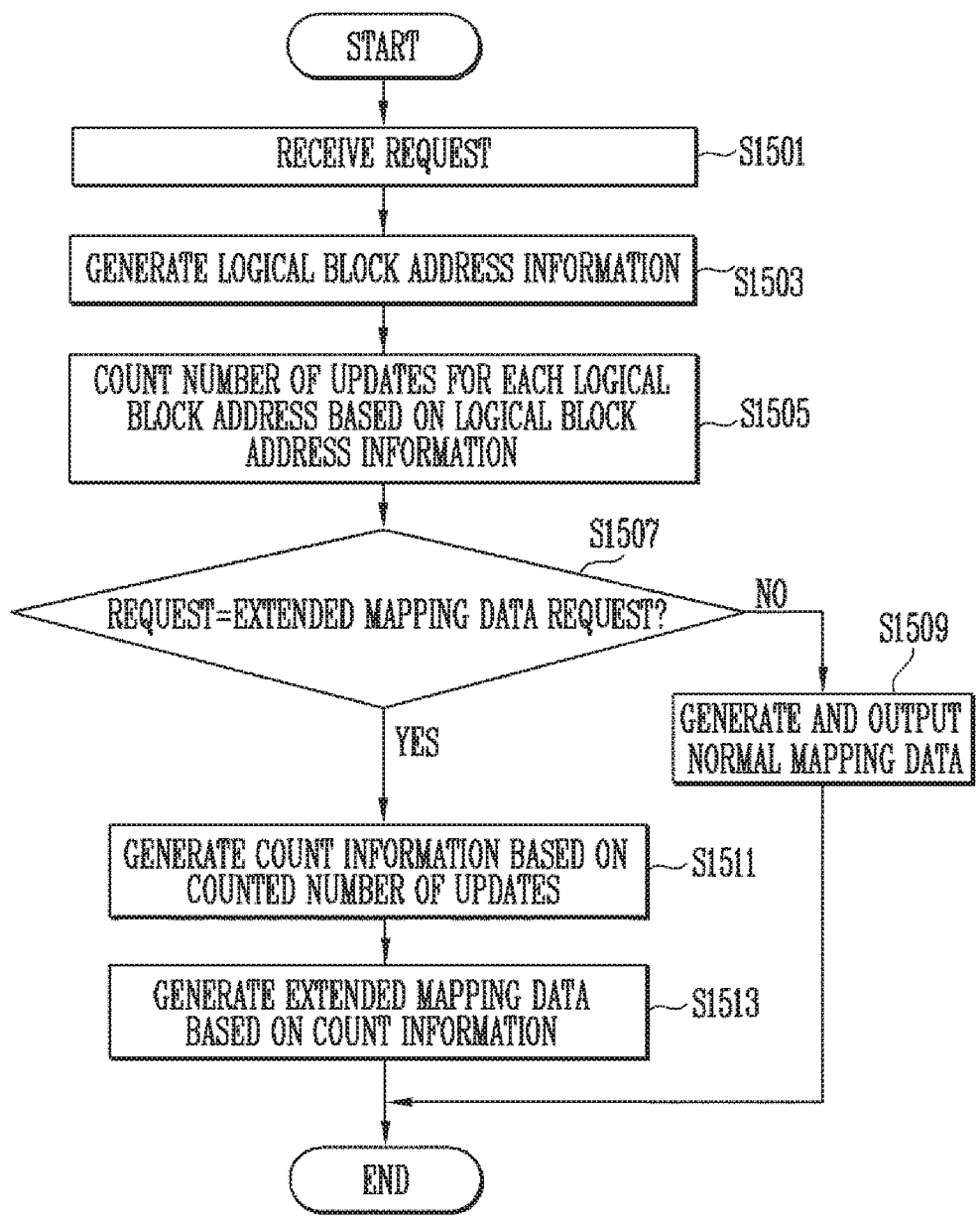
FIG. 15 is a flowchart illustrating operation of a memory controller in accordance with an embodiment of the present disclosure.

FIG. 15 is a flowchart illustrating operation of a memory controller in accordance with an embodiment of the present disclosure.

Referring to FIG. 15, the mapping data controller 210 may receive a request from the host 300 at step S1501. The received request may be a normal mapping data request or an extended mapping data request. The normal mapping data request may be a request to generate mapping data Mapping_DATA including logical block addresses (LBA) of an area other than a hot data. The extended mapping data request may be a request to generate mapping data Mapping_DATA including the logical block address (LBA) included in the hot data. When the normal mapping data request or the extended mapping data request is received from the host 300, the mapping data controller 210 may generate mapping data Mapping_DATA.

At step S1503, the mapping data controller 210 may generate logical block address information LBA_INF. The logical block address information LBA_INF may be information about a logical block address (LBA) included in the mapping data Mapping_DATA that is generated in response to the request received from the host 300.

In detail, whenever the mapping data generator 211 generates mapping data Mapping_DATA in response to the request received from the host 300, the logical block address information LBA_INF and update information UPDATE_INF may be generated. Therefore, the mapping data generator 211 may generate the logical block address information LBA_INF whenever generating the mapping data Mapping_DATA.

At step S1505, the number-of-updates counter 213 may count the number of updates of mapping data Mapping_DATA for each logical block address (LBA) based on the logical block address information LBA_INF and the update information UPDATE_INF received from the mapping data generator 211.

In detail, whenever the update information UPDATE_INF is received from the mapping data generator 211, the number-of-updates counter 213 may count the number of updates of mapping data corresponding to the logical block address included in the logical block address information LBA_INF. That is, whenever updating the mapping data Mapping_DATA, the mapping data generator 211 outputs the logical block address information LBA_INF, and thus the number of updates of the mapping data Mapping_DATA may be counted based on the logical block address information LBA_INF.

The number-of-updates counter 213 may count the number of updates of the mapping data Mapping_DATA regardless of the type of the request received from the host 300. The type of the request received from the host 300 may be a request to generate mapping data Mapping_DATA including the logical block addresses (LBA) of an area other than a hot data or a request to generate mapping data Mapping_DATA including the logical block address (LBA) included in the hot data. That is, since non-hot data can be changed to a hot data or, the hot data can be changed to a non-hot data, there is a need to count the number of updates of the mapping data Mapping_DATA regardless of the type of the request received from the host 300.

At step S1507, the mapping data generator 211 may determine whether the request received from the host 300 is an extended mapping data request. When it is determined that the received request is not an extended mapping data request, the process proceeds to step S1509. When it is determined that the received request is the extended mapping data request, the process proceeds to step S1511.

At step S1509, when the request received from the host 300 is not an extended mapping data request, that is, when the request received from the host 300 is a normal mapping data request, the mapping data generator 211 may generate and output normal mapping data. In detail, the mapping data generator 211 may generate normal mapping data in response to the normal mapping data request received from the host 300. That is, the mapping data generator 211 may generate mapping data Mapping_DATA that does not include an additional field. In this case, the mapping data generator 211 may ignore the count information COUNT_INF received from the number-of-updates counter 213.

At step S1511, the number-of-updates counter 213 may generate count information COUNT_INF based on the counted number of updates. When counting the number of updates of the mapping data Mapping_DATA, the number-of-updates counter 213 may output the count information COUNT_INF to the mapping data generator 211. The count information COUNT_INF may include information about the number of updates of the mapping data Mapping_DATA. Therefore, the number-of-updates counter 213 may output the count information COUNT_INF for each logical block address (LBA).

At step S1513, the mapping data generator 211 may generate extended mapping data based on the count information. In detail, the mapping data generator 211 may generate extended mapping data in response to the extended mapping data request received from the host 300. That is, the mapping data generator 211 may generate mapping data Mapping_DATA that includes an additional field. In this case, the mapping data generator 211 may generate mapping data Mapping_DATA in which the count information COUNT_INF received from the number-of-updates counter 213 is included in an additional field. The count information COUNT_INF may include information about the number of updates of the mapping data Mapping_DATA.

Figure 16:
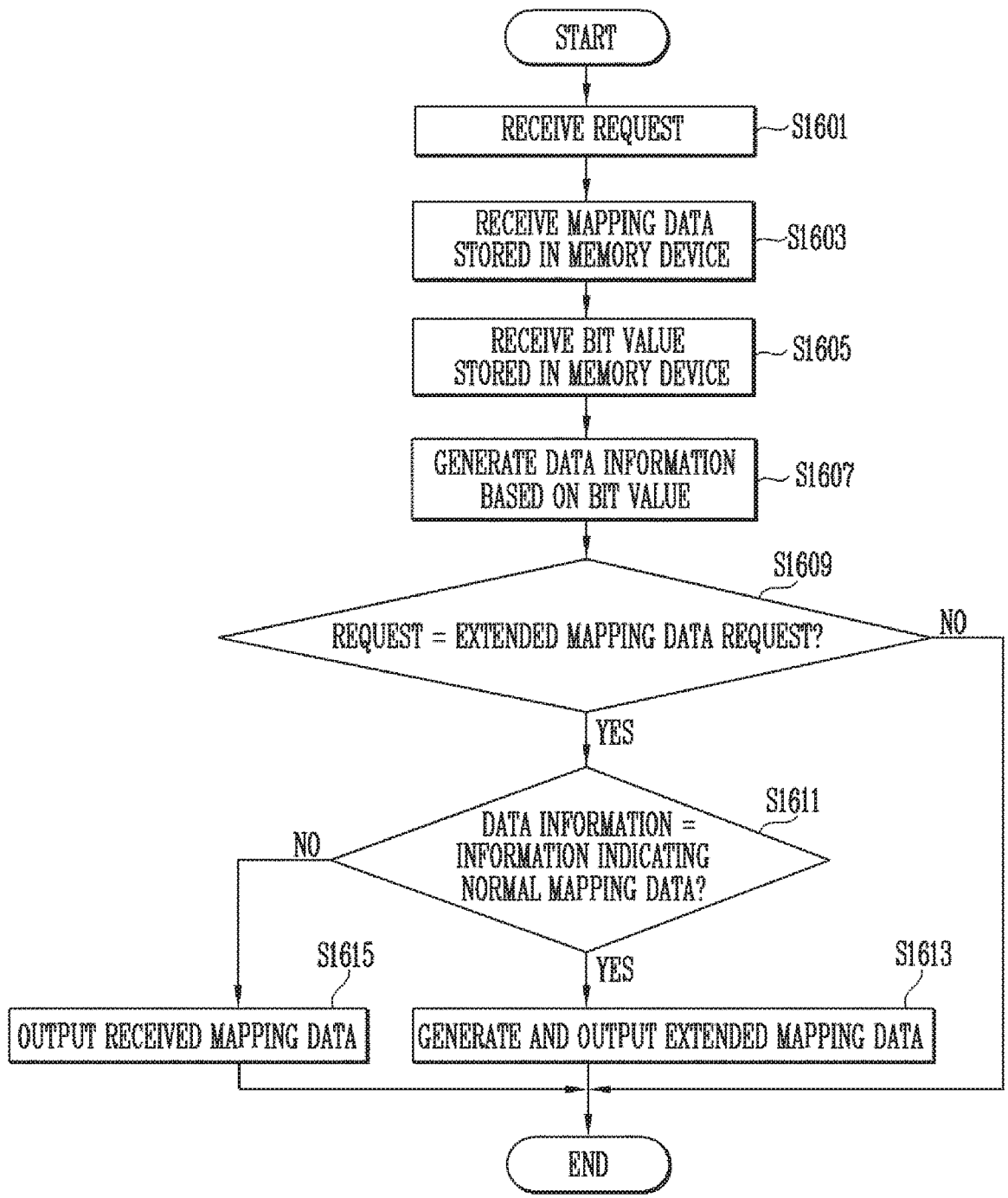
FIG. 16 is a flowchart illustrating operation of a memory controller in accordance with an embodiment of the present disclosure.

FIG. 16 is a flowchart illustrating operation of a memory controller in accordance with an embodiment of the present disclosure.

Referring to FIG. 16, the mapping data controller 210 may receive a request from the host 300 at step S1601. The request received from the host 300 may be a normal mapping data request or an extended mapping data request. The normal mapping data request may be a request to generate mapping data Mapping_DATA including logical block addresses (LBA) of an area other than a hot data. The extended mapping data request may be a request to generate mapping data Mapping_DATA including the logical block address (LBA) included in the hot data. When the normal mapping data request or the extended mapping data request is received from the host 300, the mapping data controller 210 may generate mapping data Mapping_DATA.

At step 1603, the mapping data controller 210 may receive the mapping data Mapping_DATA stored in the memory device 100.

In detail, the request received from the host 300 is a request to generate mapping data Mapping_DATA, and thus the mapping data generator 211 may perform an operation of checking whether previously generated mapping data is stored in the memory device 100. Therefore, the mapping data storage 211 may check, based on the request received from the host 300, whether mapping data Mapping_DATA including a logical block address (LBA) included in the request is stored in the memory device 100. Therefore, the mapping data generator 211 may receive mapping data Mapping_DATA corresponding to a mapping data read command requesting to read mapping data.

At step 1605, when receiving the mapping data Mapping_DATA stored in the memory device 100, the mapping data controller 210 may also receive the bit value BIT_VAL stored in the memory device 100. In detail, the mapping data controller 210 may receive the bit value BIT_VAL corresponding to a mapping data group MD_Group including the mapping data Mapping_DATA while receiving the mapping data Mapping_DATA. The bit value BIT_VAL may be included in a bitmap stored in the bitmap storage 150 of the memory device 100. The bit value BIT_VAL may be "0" or "1". The bit value BIT_VAL may distinguish normal mapping data from extended mapping data.

At step S1607, the mapping data determiner 215 may generate data information DATA_INF based on the bit value BIT_VAL. In detail, when the bit value BIT_VAL is received from the memory device 100, the mapping data determiner 215 may generate data information DATA_INF based on the bit value BIT_VAL, and may output the generated data information DATA_INF to the mapping data generator 211. The data information DATA_INF may be information indicating whether the mapping data Mapping_DATA output from the memory device 100 is normal mapping data or extended mapping data. The mapping data generator 211 may receive the data information DATA_INF from the mapping data determiner 215, and may then determine whether to generate extended mapping data.

At step S1609, whether the request received from the host 300 is an extended mapping data request may be determined. When the request received from the host 300 is the extended mapping data request, the process proceeds to step S1611.

At step S1611, whether the data information DATA_INF includes information indicating normal mapping data may be determined. The data information DATA_INF may indicate whether the mapping data Mapping_DATA output from the memory device 100 is normal mapping data or extended mapping data. When the data information DATA_INF indicates normal mapping data, the process proceeds to step S1613. When the data information DATA_INF does not indicate normal mapping data, the process proceeds to step S1615. When the data information DATA_INF does not indicate normal mapping data, the DATA_INF may indicate extended mapping data.

At step S1613, the mapping data controller 210 may generate and output extended mapping data. In detail, even if the request received from the host 300 is a request to generate extended mapping data, mapping data Mapping_DATA received from the memory device 100 may be normal mapping data. The normal mapping data may be identified through the data information DATA_INF.

In this case, the mapping data controller 210 may perform an operation of generating extended mapping data. When the extended mapping data is generated, the mapping data controller 210 may output the generated extended mapping data to the host 300.

At step S1615, the mapping data controller 210 may output the mapping data Mapping_DATA received from the memory device 100. In detail, the request received from the host 300 may be a request to generate extended mapping data, and the mapping data Mapping_DATA received from the memory device 100 may be extended mapping data. The extended mapping data may be identified through the data information DATA_INF.

In this case, the mapping data controller 210 may not perform an operation of generating extended mapping data.

That is, the mapping data controller 210 may output the mapping data Mapping_DATA received from the memory device 100.

Figure 17:
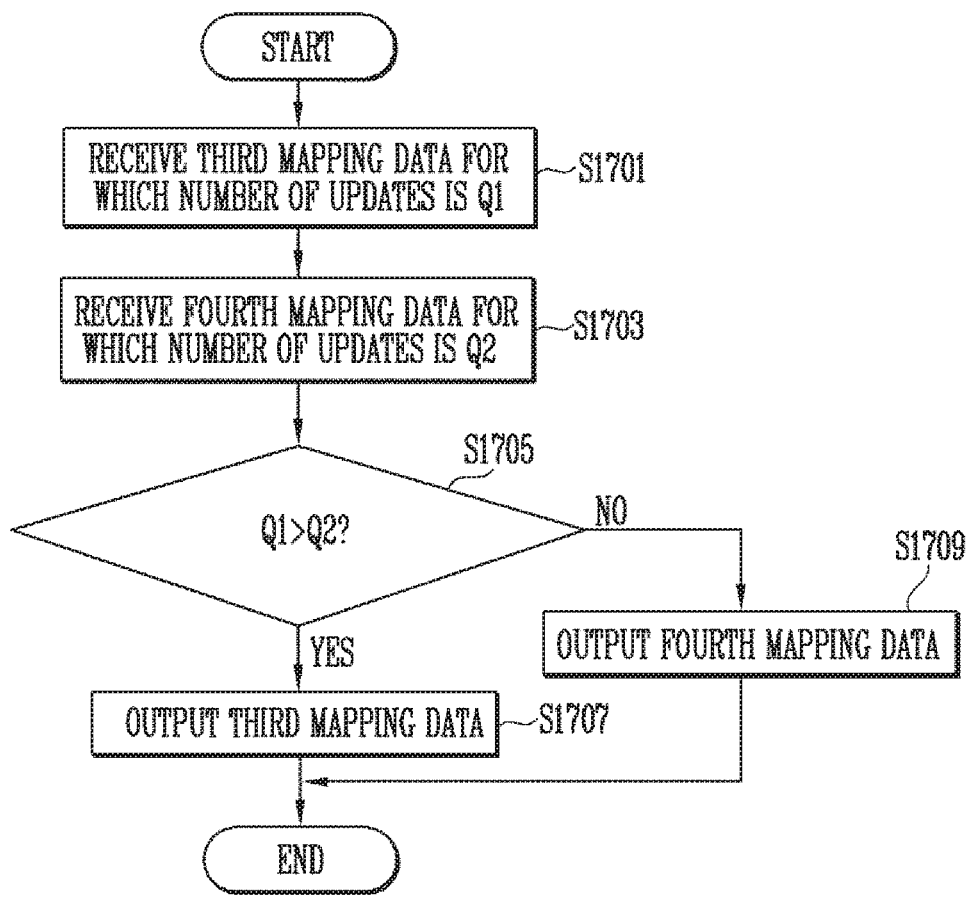
FIG. 17 is a flowchart illustrating operation of a memory controller in accordance with an embodiment of the present disclosure.

FIG. 17 is a flowchart illustrating operation of a memory controller in accordance with an embodiment of the present disclosure.

Referring to FIG. 17, the mapping data controller 210 may receive from the host 300 third mapping data Mapping_DATA3 for which the number of updates is Q1 at S1701. In detail, the mapping data controller 210 may receive the third mapping data Mapping_DATA3, together with a read request for data stored in the memory device 100, from the host 300. The third received mapping data Mapping_DATA3 may be extended mapping data. The extended mapping data may include normal mapping data and an additional field. Therefore, the number of updates stored in the additional field of the third mapping data Mapping_DATA3 may be Q1.

At step S1703, the mapping data controller 210 may receive from the memory device 100 fourth mapping data Mapping_DATA4 for which the number of updates is Q2. The received fourth mapping data Mapping_DATA4 may be extended mapping data. The extended mapping data may include normal mapping data and an additional field. Therefore, the number of updates stored in the additional field of the fourth mapping data Mapping_DATA4 may be Q2. The mapping data controller 210 may receive the fourth mapping data Mapping_DATA4 stored in the memory device 100 in response to a command requesting the mapping data Mapping_DATA.

At step S1705, whether the number of updates Q1 is greater than the number of updates Q2 may be determined. When the number of updates Q1 is greater than the number of updates Q2, the process proceeds to step S1707. When the number of updates Q1 is less than or equal to the number of updates Q2, the process proceeds to step S1709.

At step S1707, the mapping data controller 210 may output the third mapping data Mapping_DATA3 to the memory device 100 to output data, stored at a physical block address (PBA) in the third mapping data Mapping_DATA3, to the memory controller 200. Since the number of updates stored in the additional field of the third mapping data Mapping_DATA3 is greater than the number of updates stored in the additional field of the fourth mapping data Mapping_DATA4, the third mapping data Mapping_DATA3 may be output. In detail, mapping data for which the number of updates stored in the additional field of extended mapping data is larger may be generated more recently than mapping data for which the number of updates is smaller. That is, the extended mapping data for which the number of updates stored in the additional field is larger may be the most recently generated extended mapping data. Therefore, since the third mapping data has undergone a greater number of updates than the fourth mapping data, the mapping data controller 210 may output the third mapping data Mapping_DATA3.

At step S1709, the mapping data controller 210 may output the fourth mapping data Mapping_DATA4 to the memory device 100 to output data, stored at a physical block address (PBA) in the fourth mapping data Mapping_DATA4, to the memory controller 200. Since the number of updates stored in the additional field of the third mapping data Mapping_DATA3 is less than or equal to the number of updates stored in the additional field of the fourth mapping data Mapping_DATA4, the fourth mapping data Mapping_DATA4 may be output. In detail, mapping data for which the number of updates stored in the additional field of extended mapping data is smaller may be mapping data generated before mapping data for which the number of updates is larger is generated. That is, the extending mapping data for which the number of updates stored in the additional field is larger may have been more recently generated. Therefore, the mapping data controller 210 may output the fourth mapping data Mapping_DATA4.

When the numbers of updates stored in the additional fields of pieces of extended mapping data are equal to each other, the mapping data received from the host 300 is the same as the mapping data received from the memory device 100, and thus the mapping data controller 210 may output any one of the pieces of received mapping data. Therefore, the third mapping data Mapping_DATA3 and the fourth mapping data Mapping_DATA4 may be the same mapping data. At step S1709, when the numbers of updates stored in the additional fields are equal to each other, the mapping data controller 210 may output the third mapping data Mapping_DATA3 instead of the fourth mapping data Mapping_DATA4.

Figure 18:
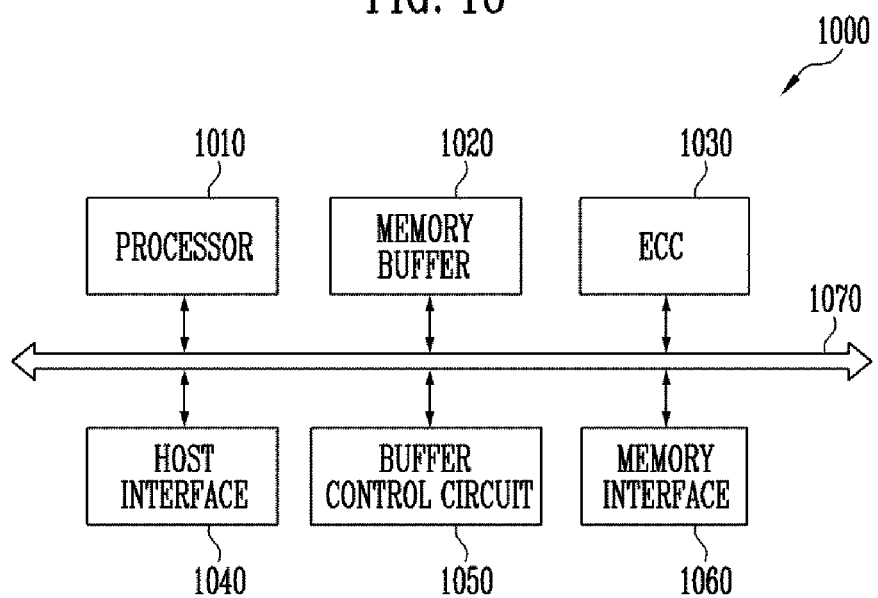
FIG. 18 is a diagram illustrating an embodiment of the memory controller of FIG. 1.

FIG. 18 is a diagram illustrating an embodiment of the memory controller of FIG. 1.

A memory controller 1000 is coupled to a host and a memory device, e.g., to host 300 and memory device 100 of FIG. 1. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 18, the memory controller 1000 may include a processor 1010, a memory buffer 1020, an error checking and correction (ECC) component (simply ECC below) 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC 1030 may perform error correction. The ECC 1030 may perform error correction code (ECC) encoding based on data to be written to the memory device through the memory interface 1060. The ECC-encoded data may be transferred to the memory device through the memory interface 1060. The ECC 1030 may perform ECC decoding based on data received from the memory device through the memory interface 1060. In an example, the ECC 1030 may be included in the memory interface 1060 as a component thereof.

The host interface 1040 may communicate with the external host under the control of the processor 1010. The host interface 1040 may perform communication using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050. Either or both of these components may be provided separately or one or both of their functions may be distributed within the memory controller 1000.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, so as not to interfere with, nor influence, each other. The data bus may be coupled to the host interface 1040, the buffer control circuit 1050, the ECC 1030, and the memory interface 1060. The control bus may be coupled to the host interface 1040, the processor 1010, the buffer control circuit 1050, the memory buffer 1020, and the memory interface 1060.

Figure 19:
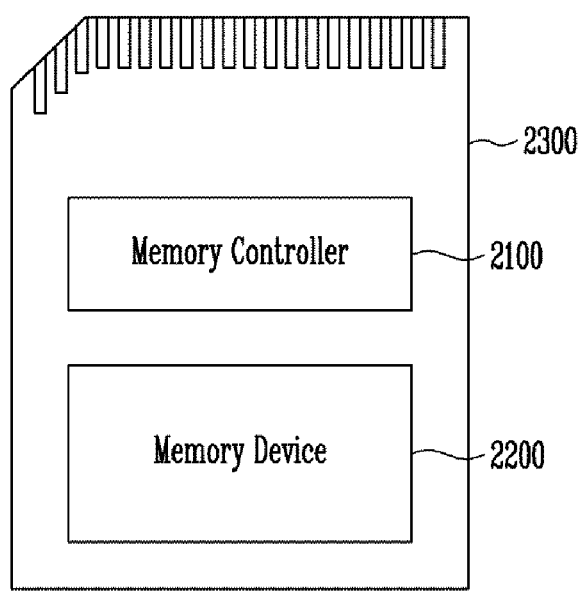
FIG. 19 is a block diagram illustrating a memory card system to which a storage device is applied in accordance with an embodiment of the present disclosure.

FIG. 19 is a block diagram illustrating a memory card system to which the storage device is applied in accordance with an embodiment of the present disclosure.

Referring to FIG. 19, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device 100 described above with reference to FIG. 10.

In an embodiment, the memory controller 2100 may include components, such as a RAM, a processor, a host interface, a memory interface, and an ECC.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-M RAM).

The memory controller 2100 and the memory device 2200 may be integrated into a single semiconductor device to configure a memory card, such as a PC card (personal computer memory card international association: PCM-CIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 20:
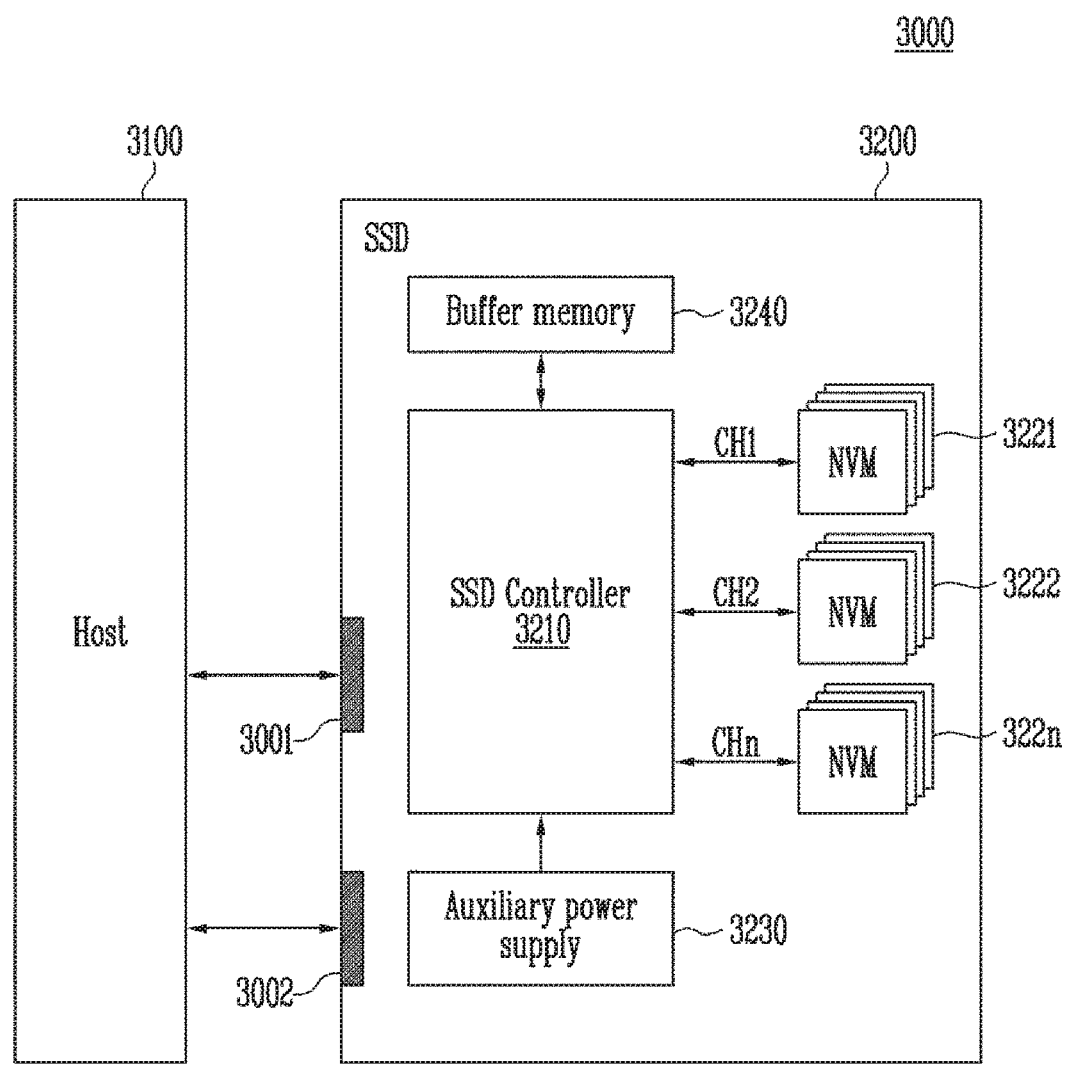
FIG. 20 is a block diagram illustrating an example of a solid state drive (SSD) system to which a storage device is applied in accordance with an embodiment of the present disclosure.

FIG. 20 is a block diagram illustrating an example of a solid state drive (SSD) system to which the storage device is applied in accordance with an embodiment of the present disclosure.

Referring to FIG. 20, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be based on the interfaces of the host 3100 and the SSD 3200. For example, the signals SIG may be defined by at least one of various interfaces, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be disposed within the SSD 3200 or provided as a separate component external to the SSD 3200. For example, the auxiliary power supply 3230 may be disposed in a main board and may supply auxiliary power to the SSD 3200.

The buffer memory 3240 may serve the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may be implemented by any of various volatile memories such as DRAM, SDRAM, DDR SDRAM, LPDDR SDRAM, and GRAM or as any of various nonvolatile memories such as FRAM, ReRAM, STT-MRAM, and PRAM.

Figure 21:
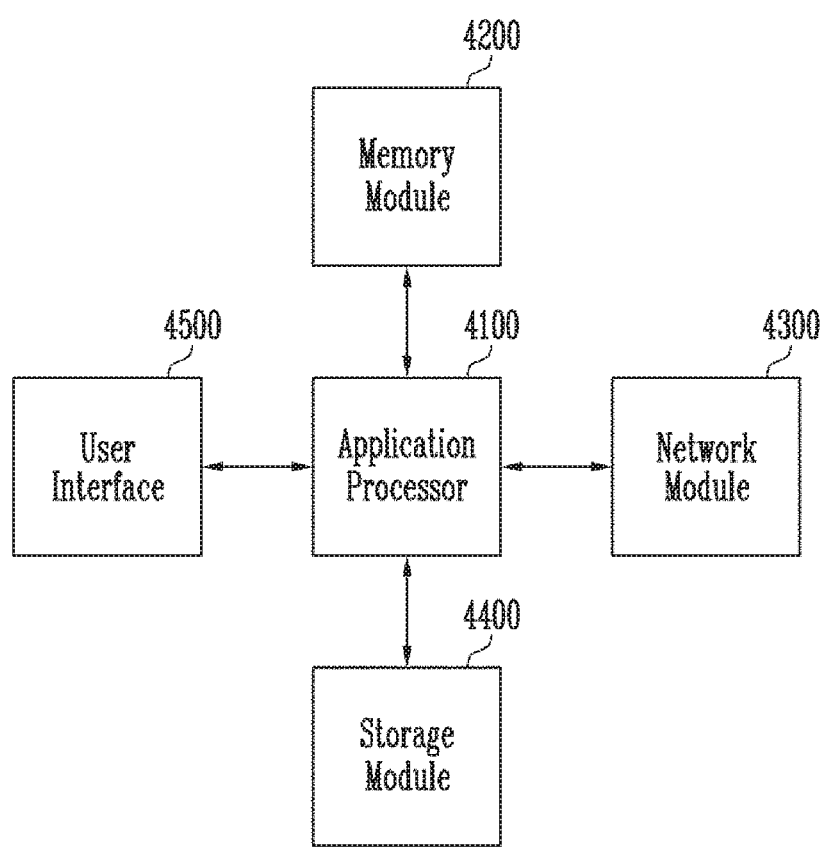
FIG. 21 is a block diagram illustrating a user system to which a storage device is applied in accordance with an embodiment of the present disclosure.

FIG. 21 is a block diagram illustrating a user system to which the storage device is applied in accordance with an embodiment of the present disclosure.

Referring to FIG. 21, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may be implemented as any of various volatile RAMs such as DRAM, SDRAM, DDR SDRAM, DDR2 SDRAM, DDR3 SDRAM, LPDDR SDRAM, and LPDDR3 SDRAM, or implemented as any of various nonvolatile RAMs such as PRAM, ReRAM, MRAM, and FRAM. In an embodiment, the application processor 4100 and the memory module 4200 may be packaged based on package-on-package (POP) as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 10 to 13. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a memory controller for generating mapping data having improved reliability and a method of operating the memory controller are provided.

While embodiments of the present disclosure have been disclosed, those skilled in the art will appreciate in light of the present disclosure that various modifications, additions and substitutions are possible. Therefore, the scope of the present invention is defined by the appended claims and their equivalents, rather than by the description preceding them.

In the above-discussed embodiments, in some cases one or more steps may be selectively performed or skipped. In addition, the steps may not always be sequentially performed in given order, and may be randomly performed. Furthermore, the embodiments disclosed herein aim to help those with ordinary knowledge in this art more clearly understand the present invention, rather than aiming to limit the bounds of the present invention. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present invention as defined in the appended claims and their equivalents.

What is claimed is:

1. A memory controller for controlling a memory device, comprising:
   a mapping data controller configured to generate extended mapping data including mapping information and an additional field in response to an extended mapping data request received from a host and to generate data generation information indicating that the extended mapping data has been generated, wherein the mapping information indicates a mapping relationship between a logical block address and a physical block address; and
   a bitmap information generator configured to receive the data generation information and generate bitmap information,
   wherein the bitmap information includes information for changing a bit value corresponding to a mapping data group including the extended mapping data, among bit values in a bitmap stored in the memory device, to indicate the extended mapping data, and
   wherein the mapping data group comprises a plurality of pieces of mapping data.

2. The memory controller according to claim 1,
   wherein the extended mapping data includes a logical block address of a hot data, and
   wherein the hot data is determined based on a frequency with which the host outputs a specific logical block address to the memory controller.

3. The memory controller according to claim 1, wherein the mapping data controller is configured to generate normal mapping data including the mapping information indicating the mapping relationship between the logical block address and the physical block address in response to the extended mapping data request, and then generate the extended mapping data.

4. The memory controller according to claim 3, wherein the additional field stores a number of updates of the extended mapping data.

5. The memory controller according to claim 3, wherein the additional field stores data for error correction.

6. The memory controller according to claim 4, wherein the mapping data controller is configured to:
   accumulate, as the mapping data is updated in response to a request received from the host, the number of updates for each logical block address in the mapping data, and
   generate, when the extended mapping data is generated, data indicative of the accumulated number of updates.

7. The memory controller according to claim 6, wherein the mapping data controller is configured to:
   receive first mapping data and a bit value corresponding to a mapping data group including the first mapping data from the memory device in response to a mapping data request received from the host, and
   generate, when the mapping data request is a request for the extended mapping data, second mapping data based on the first mapping data and the bit value.

8. The memory controller according to claim 7, wherein, when the first mapping data is the normal mapping data and the mapping data request is a request for the extended mapping data, the second mapping data is the extended mapping data.

9. The memory controller according to claim 4, wherein the mapping data controller is configured to:
   receive a mapping data request and third mapping data stored in the host from the host, and receive fourth mapping data corresponding to the mapping data request from the memory device, each of the third and fourth mapping data being the extended mapping data, and output one of the third mapping data and the fourth mapping data to the memory device to read data corresponding to the outputted mapping data based on the number of updates stored in an additional field of each of the third mapping data and the fourth mapping data.

10. The memory controller according to claim 9, wherein the mapping data controller is configured to:

output the third mapping data when the number of updates stored in the additional field of the third mapping data is greater than the number of updates stored in the additional field of the fourth mapping data, and output the fourth mapping data when the number of updates stored in the additional field of the third mapping data is less than the number of updates stored in the additional field of the fourth mapping data.

11. A method of operating a memory controller for controlling a memory device, the method comprising:

receiving an extended mapping data request from a host;

generating normal mapping data including mapping information to the extended mapping data request, wherein the mapping information indicates a mapping relationship between a logical block address and a physical block address;

generating extended mapping data including the mapping information and an additional field;

generating data generation information indicating that the extended mapping data has been generated; and receiving the data generation information and then generating bitmap information, wherein the bitmap information includes information for changing a bit value corresponding to a mapping data group including the extended mapping data, among bit values in a bitmap stored in the memory device, to indicate the extended mapping data, and wherein the mapping data group comprises a plurality of pieces of mapping data.

12. The method according to claim 11, wherein the additional field stores a number of updates of the extended mapping data.

13. The method according to claim 11, wherein the additional field stores data for error correction.

14. The method according to claim 12, further comprising accumulating, when mapping data is updated in response to a request received from the host, the number of updates for each logical block address included in the mapping data.

15. The method according to claim 14, wherein generating the extended mapping data includes generating the extended mapping data in which the accumulated number of updates is stored in the additional field.

16. The method according to claim 11, further comprising:

receiving from the memory device first mapping data and a bit value corresponding to a mapping data group including the first mapping data in response to a mapping data request received from the host; and generating, when the mapping data request is a request for the extended mapping data, second mapping data based on the first mapping data and the bit value.

17. The method according to claim 16, wherein the second mapping data is the extended mapping data when the first mapping data is the normal mapping data and the mapping data request is a request for the extended mapping data.

18. The method according to claim 12, further comprising:

receiving a mapping data request and third mapping data stored from the host, the third mapping data being extended mapping data;

receiving fourth mapping data corresponding to the mapping data request from the memory device, the fourth mapping data being extended mapping data; and outputting one of the third mapping data and the fourth mapping data to the memory device to read data corresponding to the outputted mapping data based on the number of updates stored in an additional field of each of the third mapping data and the fourth mapping data.

19. The method according to claim 18, wherein outputting one of the third mapping data and the fourth mapping data includes:

outputting the third mapping data when the number of updates stored in the additional field of the third mapping data is greater than the number of updates stored in the additional field of the fourth mapping data, and outputting the fourth mapping data when the number of updates stored in the additional field of the third mapping data is less than the number of updates stored in the additional field of the fourth mapping data.

* * * * *